US008739728B2

(12) United States Patent
Rebstock et al.

(10) Patent No.: US 8,739,728 B2
(45) Date of Patent: Jun. 3, 2014

(54) METHODS AND APPARATUSES FOR ROLL-ON COATING

(75) Inventors: Lutz Rebstock, Gaienhofen (DE); Klaus Conrad Wolke, Althengstett (DE)

(73) Assignee: Dynamic Micro Systems, Semiconductor Equipment GmbH, Radolfzell (DE)

( * ) Notice: Subject to any disclaimer, the term of this patent is extended or adjusted under 35 U.S.C. 154(b) by 310 days.

(21) Appl. No.: 13/081,506

(22) Filed: Apr. 7, 2011

(65) Prior Publication Data
US 2012/0255488 A1    Oct. 11, 2012

(51) Int. Cl.
*B05C 1/10* (2006.01)
*B05C 1/08* (2006.01)
*B05C 1/06* (2006.01)
*B05C 13/02* (2006.01)
*B05C 1/02* (2006.01)
*B05C 9/04* (2006.01)
*B05D 1/28* (2006.01)

(52) U.S. Cl.
CPC ............. B05C 1/0808 (2013.01); B05C 1/10 (2013.01); B05C 1/025 (2013.01); B05C 9/04 (2013.01); B05D 1/28 (2013.01); B05D 2252/10 (2013.01)
USPC ............ 118/258; 118/264; 118/255; 118/200

(58) Field of Classification Search
None
See application file for complete search history.

(56) References Cited

U.S. PATENT DOCUMENTS

| 3,196,038 | A  | * | 7/1965 | Schoch et al. ............... 427/211 |
| 3,805,738 | A  |   | 4/1974 | Kitazawa |
| 5,618,388 | A  | * | 4/1997 | Seeser et al. ............... 204/192.12 |
| 7,104,216 | B2 | * | 9/2006 | Suzuki et al. ................ 118/46 |
| 8,230,804 | B1 | * | 7/2012 | Barbieri ........................ 118/222 |
| 2003/0175441 | A1 |   | 9/2003 | Bernards |
| 2004/0046497 | A1 | * | 3/2004 | Schaepkens et al. ......... 313/506 |
| 2006/0045981 | A1 | * | 3/2006 | Tsushi et al. ............. 427/428.01 |
| 2008/0210294 | A1 | * | 9/2008 | Moslehi ........................ 136/251 |
| 2011/0030772 | A1 | * | 2/2011 | Veerasamy ................... 136/256 |
| 2011/0030879 | A1 | * | 2/2011 | Veerasamy ..................... 156/99 |
| 2011/0030991 | A1 | * | 2/2011 | Veerasamy ................ 174/126.1 |
| 2011/0033688 | A1 | * | 2/2011 | Veerasamy ................... 428/220 |
| 2011/0143045 | A1 | * | 6/2011 | Veerasamy ................... 427/495 |
| 2012/0060928 | A1 | * | 3/2012 | Johnson et al. ............... 136/264 |
| 2012/0145219 | A1 | * | 6/2012 | Medwick et al. ............ 136/246 |
| 2012/0208013 | A1 | * | 8/2012 | Clapper et al. .......... 428/355 AC |

FOREIGN PATENT DOCUMENTS

WO        03/054975        7/2003

OTHER PUBLICATIONS

S. Queisser, Novel precursor deposition method for inline diffusion, 23 EU-PVSEC, Valencia 2008.
PCT preliminary report on patentability—PCT/IB2012/000710— dated Oct. 8, 2013.

* cited by examiner

*Primary Examiner* — Dah-Wei D Yuan
*Assistant Examiner* — Jethro Pence
(74) *Attorney, Agent, or Firm* — Tue Nguyen

(57) ABSTRACT

Methods and apparatuses for a deposition system are provided to deposit a thin coating layer on flat substrates, such as semiconductors or panels. In an embodiment, liquid supplied rollers accepting liquid media provide liquid chemicals to the substrates for coating the substrates. The liquid delivery system can control the flow and the pressure of the liquid to achieve optimum process condition with minimum excess waste. In another embodiment, rollers with non-uniform distribution of liquid media provide a non-uniform thickness profile on the substrates, which can be used to compensate for the non-uniformity of subsequent processes.

22 Claims, 17 Drawing Sheets

METHODS AND APPARATUSES FOR ROLL-ON COATING

This application is related to co-pending application "Methods and apparatuses for roll-on coating", of the same inventors.

BACKGROUND

In photovoltaic devices, electrical energy is converted from light via the photoelectric effect and resulting charges are collected via pn junctions in semiconductor substrates for current generation. PN junctions can be formed by means of diffusing dopants into the bulk semiconductor material. The diffusion process can occur from a dopant vapor ambient, for example, phosphine or $POCl_3$, or from solid source releasing dopant vapor. Another process can employ a dopant layer coated on the substrate, which, upon heating or firing, causes the dopant to diffuse from the dopant layer into the substrate. Another important process in solar cell fabrication is thin film deposition, such as the coating of passivation or absorber layer.

In-line fabrication processes, such as in-line doping diffusion or in-line thin film deposition, are preferred processes for minimizing cost and toxicity. For example, in a typical in-line diffusion process, the substrate is coated with a dopant containing layer and subsequently, the dopants from the dopant layer are diffused into the substrate in a furnace. The coating of the dopant source can be accomplished by spraying, dipping, spin-on, or condensation of a dopant-containing chemical, in liquid or gaseous form, with or without solvent, and with or without carrier gas. Such systems can be difficult to control with respect to uniformity and doping levels, particularly on textured surfaces. Also these processes often require significant excess chemicals, driving up the cost of production.

SUMMARY

The present invention relates to methods and apparatuses for coating substrates, such as coating thin films or dopant layers on single crystalline or multicrystalline silicon substrates. In an embodiment, the present invention discloses a roll-on coating process for coating a layer on the substrate surfaces, for example, a passivation or absorber layer, or a dopant layer in which the dopants are then diffuse into the substrate after a high temperature anneal, forming a pn junction for solar cells.

In an embodiment, the present invention discloses a system for roll-on coating a substrate, comprising at least a roller accepting a fluid flow and then migrating the fluid to the roller surface. Upon contacting a substrate surface, the fluid on the roller's surface is transferred to the substrate surface, forming a coating layer. The fluid can comprise active chemicals in a solution mixture, which is subsequently dried to form a solid thin film layer on the substrate. The fluid can comprise a dopant chemical, which is continuously supplied to the roller for coating a plurality of substrate surfaces by rolling contact. The dopant chemical can contain boron, arsenic or phosphorus chemical in a solution or mixture form.

In an embodiment, the present invention discloses a fluid supplying roller, comprising a cylindrical structure spanning across a large substrate or a number of smaller substrates. The substrates can be positioned above the roller, under the roller, or sandwiched between two rollers, and moved relative to a rotation of the roller. The fluid supplying roller can be configured to accept a fluid flow at one end of the roller and to supply fluid at the roller's surface. The roller can be hollow or can have inner channels for guiding the fluid along the length of the roller. The surface of the roller can have a plurality of holes distributed along the length of the roller's core and connected with the inner channels for transferring the fluid to the outer surface of the roller. In one embodiment, the roller can further comprise a soft porous layer covering the outer surface of the roller, which is wetted with the fluid at the roller's surface, for example, the fluid coming from the holes distributed along the length of the roller's core. Upon contacting a substrate, the wetted porous layer can transfer the fluid to the substrate surface, effectively coating the substrate surface with layer of the fluid. In an embodiment, the fluid supplied roller is configured for delivering a uniform coating across the substrate surface, for example, by a uniform distribution of the holes along the length of the roller's core, or by a uniform pore density of the porous layer along the length of the roller. In another embodiment, the roller is configured to tailor the delivery of the fluid, effectively providing different coating thickness at different portions of the substrates, for example, by a non-uniform distribution of holes or a non-uniform pore density of the porous layer. This thickness non-uniformity can be used to compensate for subsequent process non-uniformity, for example, the non-uniformity of the anneal temperature in a diffusion furnace during the dopant drive-in process.

In an embodiment, temperature control devices such as heaters or coolers can be provided for heating or cooling the fluid, either at the fluid reservoir, at the fluid delivery lines, and/or at the fluid within the roller. In addition, heaters/coolers can be provided to heat/cool the roller and/or to heat/cool the substrates, for example, in the coating process.

In an embodiment, the present invention discloses an in-line coating system, comprising a plurality of rotating fluid supplied rollers for coating a substrate. The fluid supplied roller can be positioned above the substrate for coating the top surface of the substrate. The wetted roller can be positioned under the substrate for coating the bottom surface of the substrate. Two rollers can sandwich the substrate to coat the top and bottom surfaces of the substrate simultaneously. The rotating rollers can double as a transporting mechanism, continuously moving a plurality of substrates from an input to an output stage of the in-line coating system. The in-line coating system can further comprise means of controllably reducing the amount of dopant or carrier fluid on the substrates, such as additional liquid absorbing intrinsically dry rollers.

In an embodiment, the in-line coating system further comprises additional coating mechanisms, such as spraying nozzles for delivering additional fluid onto the substrate surfaces. Further the in-line coating system can comprise additional roller wetting mechanisms, such as providing an outer belt to deliver fluid to the outer surface of the roller, or providing a fluid-filled pan for mounting the roller.

In an embodiment, the present invention discloses an integrated in-line processing system, comprising an in-line coating system for coating a dopant layer on the substrates feeding an in-line furnace anneal system for driving the dopant into the substrates from the surface coating layer. The coating system and the furnace anneal system can be disposed next to each other, or can be separated, for example, by a transport line. The system may also consist of a pre-conditioning step prior to processing such as ozone treatment or chemical oxidation.

DETAILED DESCRIPTION OF THE PREFERRED EMBODIMENTS

The present invention relates to methods and systems for uniform deposition of materials on a flat substrate, such as photovoltaic substrates, for creation of thin layers by a roll-on technology. The thin layers can be any layer deposited by a liquid material. For example, the thin layers can comprise Phosphorus or Boron, deposited on a semiconductor layer for emitter formation after subsequent treatments. The thin layers can also be absorber layers, for example CdS or ZnS, in thin film photovoltaic processing.

The present invention further pertains to the manufacture of photovoltaic cells, such as in crystalline solar cell manufacturing, including improved dopant coating processes and systems for producing photovoltaic emitter junctions by dopant diffusion. The substrate is preferably single crystal or multicrystalline (or polycrystalline) substrate, but other semiconductor substrate can also be utilized. The present invention can provide high performance junctions for cost reduction and efficiency improvement in photovoltaic cells and related devices. In an embodiment, the substrate is first exposed to a fluid-containing surface comprising dopant material, such as phosphorus, arsenic, or boron compounds, such as phosphoric acid ($H_3PO_4$). The exposure will form a dopant coating on the substrate surface. Afterward, the dopant coating maybe subjected to a high temperature ambient to diffuse the dopant into the substrate or annealed in a furnace at high temperature, for example, between 600 and 1000 C.

In another embodiment, the present invention discloses a deposition process by liquid roll-on technology, such as absorber layers in thin film photovoltaic, including controlled heating of the substrates for deposition of the layer constituents from the coating fluid, for example by crystallization.

Figure 1A:
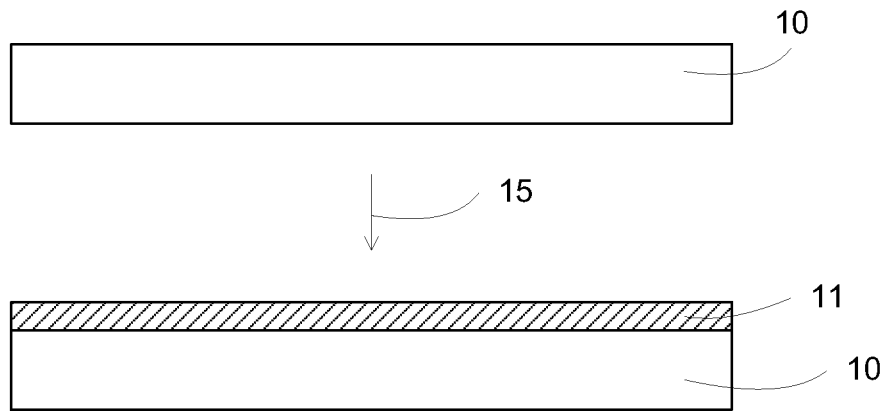
FIGS. 1A-1B illustrate exemplary process flows according to embodiments of the present invention.

FIG. 1A illustrates an exemplary process flow according to an embodiment of the present invention. A substrate 10 is provided, which can comprise various layers, such as a semiconductor layer. The substrate 10 is then exposed to a liquid coating process 15, which forms a dropletless liquid coating layer 11 on the substrate 10. The layer 11 can be formed by contact with a fluid surface to generate a liquid layer coated on the substrate, and then can be dried in an elevated temperature ambient.

Figure 1B:
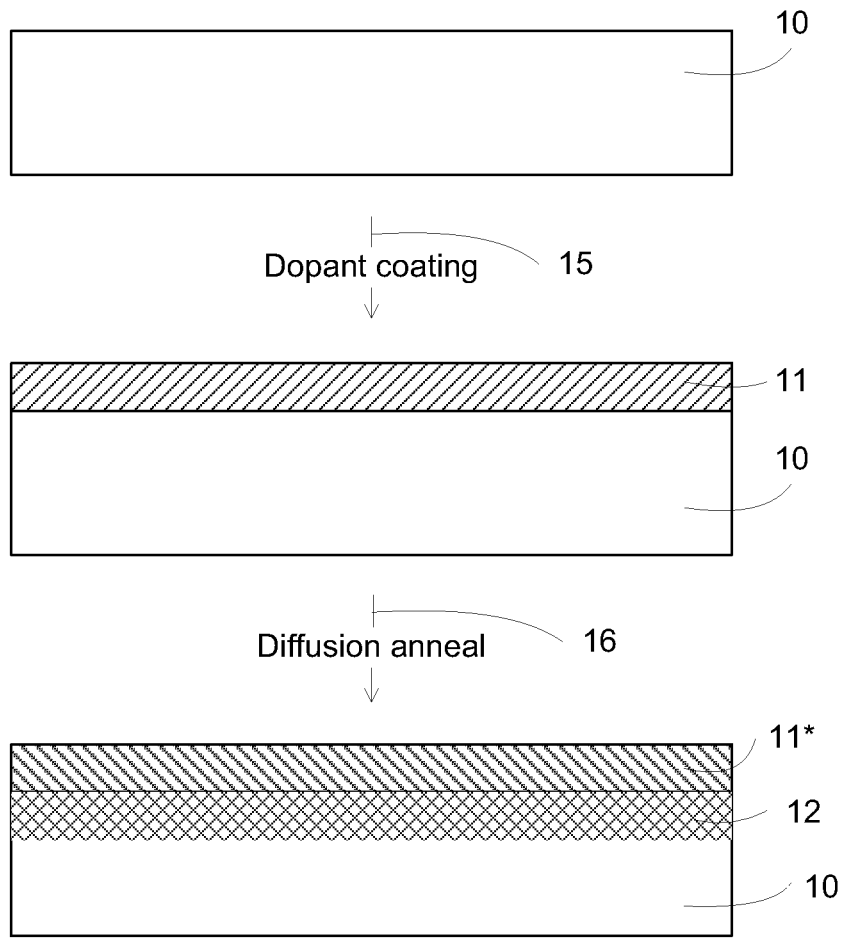

FIG. 1B illustrates another exemplary process flow according to an embodiment of the present invention. A substrate 10 is provided, which is preferably a semiconductor substrate, such as a single crystal or multicrystalline silicon substrate. Alternatively, the substrate can comprise a layer of semiconductor material on a support substrate. The substrate material can also be non-semiconductor, such as W, ITO or metallic mirror material. In addition, other processes can be performed on the substrate 10 before exposing the substrate to the dopant ambient. For example, an oxide passivation layer can be formed on the silicon substrate to protect the substrate, or a hydrophilic layer can be coated on the surface of the substrate 10 to improve the wettability of the substrate surface. The passivation layer can further prevent high concentration of dopant at the surface of the semiconductor substrate. For example, at the interface of the dopant layer, a high concentration of dopant can be formed after a high temperature diffusion process, which might affect the quality and functionality of the pn junction. Thus the passivation layer can protect the semiconductor substrate from this high surface concentration. The buffer layer can also act as an interface layer between the dopant and the substrate, providing adhesion and surface preparation for the coating of the dopant layer.

The substrate 10 is then exposed to a dopant coating process 15, which forms a dopant layer 11 on the substrate 10. The dopant layer 11 is preferably a solid dopant source, comprising the appropriate dopant for forming a pn junction with the semiconductor substrate 10. The dopant layer 11 can be formed by contact with a fluid surface to generate a liquid layer coated on the substrate, and then dried in an elevated temperature ambient. The coating process comprises a dopant precursor, such as phosphorus-containing chemicals (phosphorus acid, phosphine), boron-containing chemicals, or arsenic-containing chemicals. The dopant precursors can be delivered in liquid or semi-liquid form, and with or without solvent or carrier gas. Other dopant sources in liquid form can be used, including solutions and mixtures.

In an embodiment, the dopant material is phosphorus, for example, from phosphorus acid solution. For example, phosphorus acid solution is applied to the core of the roller, which then rolls on the substrate to form a phosphoric acid coating. An exhaust or a hood, and a capture pan can be included to capture any phosphorus acid not adhered to the substrate.

The substrate may then be dried 11* and annealed 16 in a diffusion furnace, or the substrate may be directly annealed without a dry step. The anneal temperature may be about 800 to 900 C to drive phosphorus into the substrate to form a doping layer 12.

In an embodiment, the present invention discloses a system for coating a substrate, comprising a rotated roller with outer surface wetted from a fluid supplied through an inner core. In an embodiment, the present system comprises a plurality of rotated soft porous rollers for liquid media deposition, wherein the rollers is wetted with the liquid media supplied from one end of the rollers. The rotated soft porous rollers can be used to simultaneously transport the substrates, for example, in an in-line conveyor mechanism.

An advantage of the invention includes the ability to combine the transport of the substrates in an inline process system with the deposition process. The substrates are fed through the system in single or multiple parallel lanes by a sequence of rotated rollers, which can be positioned on top and/or bottom of the substrates. Rotating the rollers will move the substrates linearly from the input of the in-line process system to the output end. Liquid media is supplied to the rollers at one end, and traveled through inner channels of the rollers to wet the outer surface. Liquid layers are then dispensed with ultrathin thickness onto the substrates while moving through the equipment.

Figure 2A:
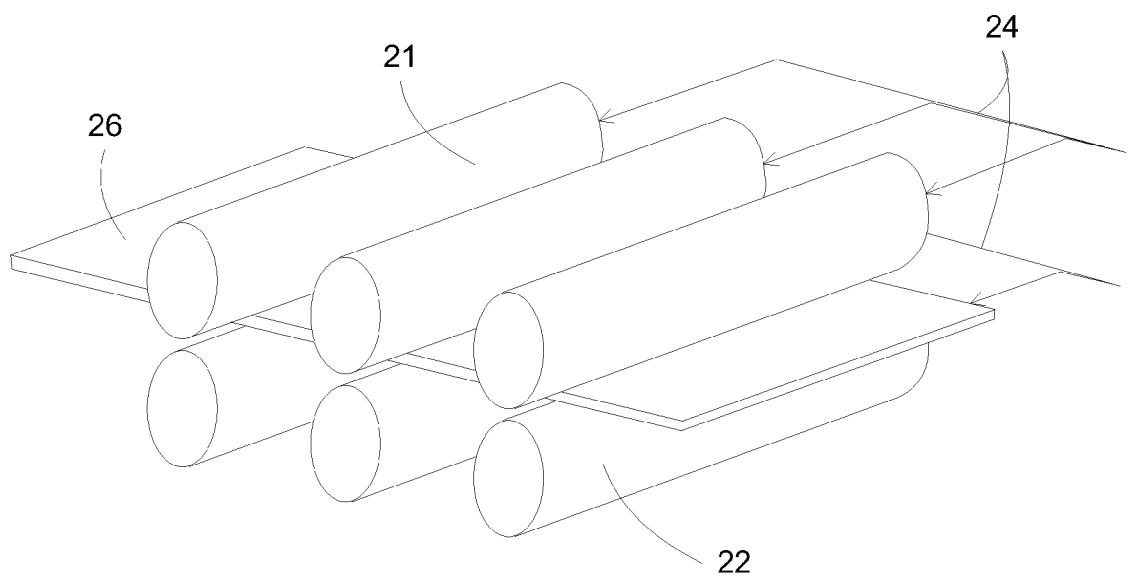
FIGS. 2A-2B illustrate exemplary schematics of the basic coating method and apparatus concept according to an embodiment of the present invention.
Figure 2B:
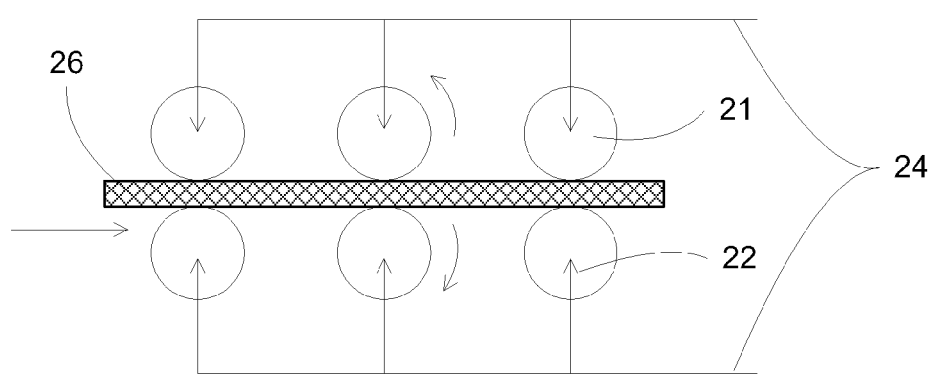

FIGS. 2A and 2B illustrate an exemplary schematic of basic equipment concept according to an embodiment of the present invention. The media are supplied 24 through the inner core of the soft porous rollers 21 and 22 which due to their material behavior are wetted uniformly. The dispense of media onto the substrate 26 is controlled independently by liquid flow and liquid concentration as well as the contact pressure due to the spacing between the top rollers 21 and the bottom rollers 22 in a way to deposit a thin uniform film on the top and bottom surfaces of the substrate 26 with minimum surplus media. In rotating the rollers 21 and 22, the substrates are transported from one end of the equipment to the other end of the equipment, in addition to gaining a coating of liquid supplied from the rollers' wet surfaces.

In an embodiment, the porous rollers comprise a rigid hollow core surrounded by a layer of porous material such as a sponge material. The rigid core preferably has adequate stiffness and horizontal flatness across the deposition area of the substrates to ensure uniform deposition of the coating layer. The core material can be metal, alloys, carbon, glass, ceramic, or plastic such as PVC, PP or fluorocarbons.

The porous material can be polymer or polymer foams or sponge, such as PVA, Poly urethane and poly olefin, or can be any materials with pores to allow the liquid media to pass through. In addition, the porous material can be a soft material, which can help in relaxing the requirement of the horizontal flatness of the rigid core.

Figure 3A:
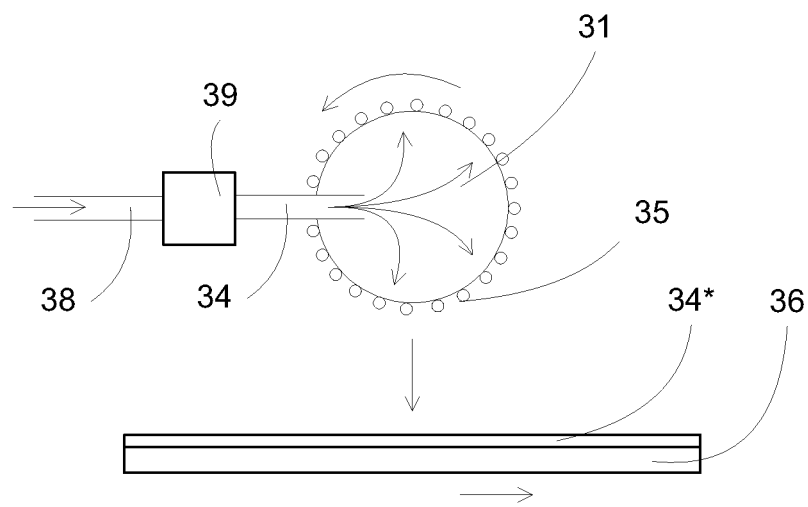
FIGS. 3A-3E illustrate various configurations for the roller according to an embodiment of the present invention.
Figure 3B:
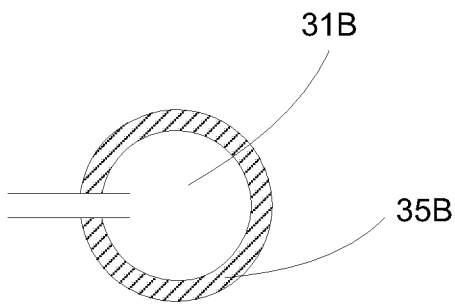
Figure 3C:
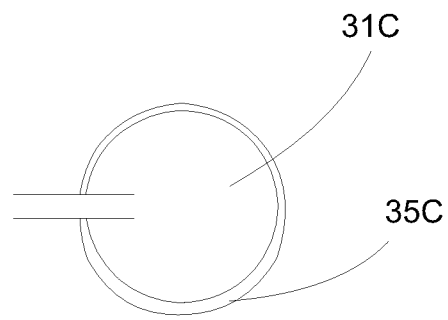

FIGS. 3A-3C illustrate various configurations for the roller according to an embodiment of the present invention. FIG. 3A shows a roller 31 having inlet 34 at one end of the roller to accept a fluid media, which is distributed 35 to the outer surfaces of the roller. When contacting substrate 36, the fluid media is transferred to the contacting surface, forming a liquid layer 34*. The roller 31 can rotate for better spreading the fluid on the substrate surface. A coupler 39 can be coupled between the rotating roller 31 (or the inlet 34) and the stationary fluid entrance 38. The coupler 39 can comprise rotatable seal, or a twistable connection to accommodate the rotating roller.

The roller 31B can comprise a soft porous layer 35B at the outer surface of the roller for ease of fluid transfer between the roller and the substrate (FIG. 3B). The outer surface of the roller 31C can be covered with a solid layer 35C, preferably a soft layer for improve contact tolerance. The fluid then forms a layer at the outer surface of the roller, which can be transferred by contact to the substrate surface (FIG. 3C).

Figure 3D:
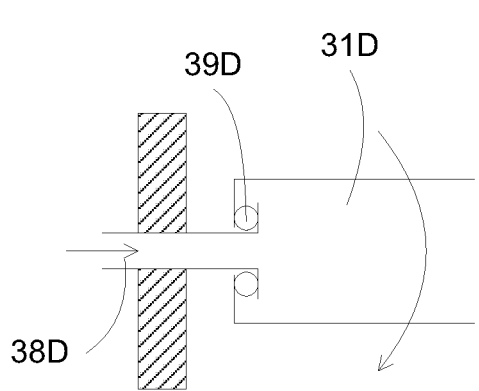
Figure 3E:
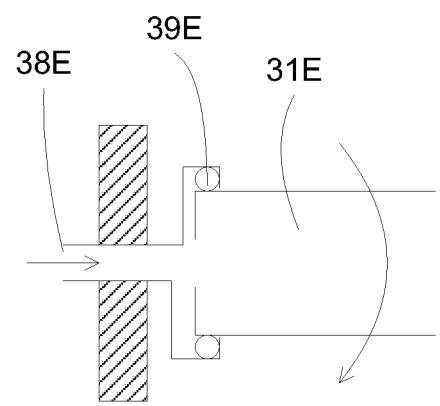

FIGS. 3D-3E illustrate various exemplary configurations for a rotatable coupler between a rotating roller and a fixed liquid delivery line. In FIG. 3D, o-ring or liquid bearing 39D is disposed at an extreme end of the roller 31D, coupling a fixed line 38D with the rotating roller 31D. In FIG. 3E, o-ring or liquid bearing 39E is disposed at a cylindrical surface near a vicinity end of the roller 31E, coupling a fixed line 38E with the rotating roller 31E. Other rotatable coupler can be used, for connecting a rotating roller with a fixed liquid delivery line.

Figure 4A:
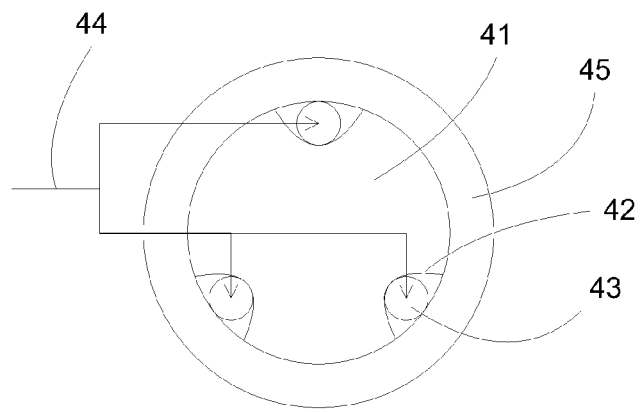
FIGS. 4A-4D illustrate other roller configurations according to an embodiment of the present invention.
Figure 4B:
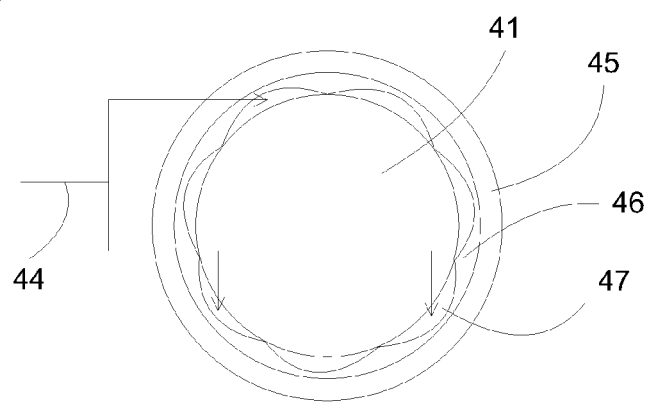
Figure 4C:
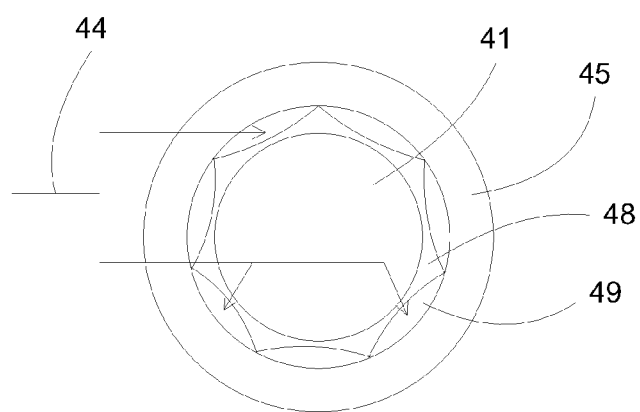
Figure 4D:
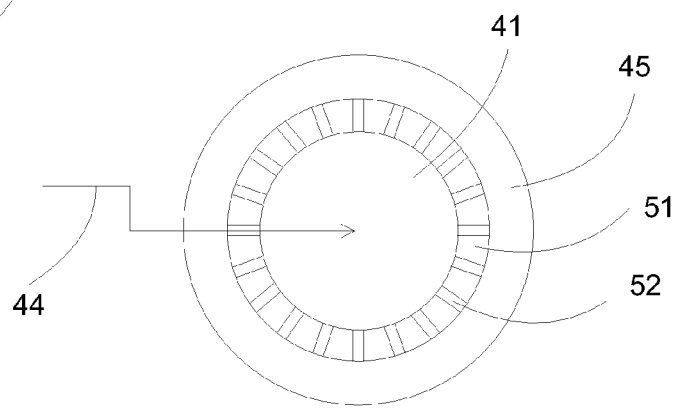

FIGS. 4A-4D illustrate other roller configurations according to an embodiment of the present invention. FIG. 4A shows roller 41 comprising a porous layer 45 covering a solid core with trenches 42 that can hold small diameter tubing (PFA, PVDF, PP) 43. Liquid media 44 enters the small tubing 43 and transfers to the porous layer 45 through perforations in the tubing 43. Diameter and spacing of the perforation holes of the tubing 43, together with the pore density of the porous layer 45, can be varied to optimize uniformity and media flow. FIG. 4B shows roller 41 having outer cover layer 46 with trenches 47. Liquid media 44 enters the trenches 47 and transfers to the porous layer 45 through perforations in the trenches 47. FIG. 4C shows hollow roller 41 having inner layer 48 with trenches 49. Liquid media 44 enters the trenches 49 and transfers to the porous layer 45 through perforations in the trenches 49. FIG. 4D shows hollow roller 41 having perforation 52 in the roller walls 51. Liquid media 44 enters the hollow roller and transfers to the porous layer 45 through perforations 52.

Figure 5A:
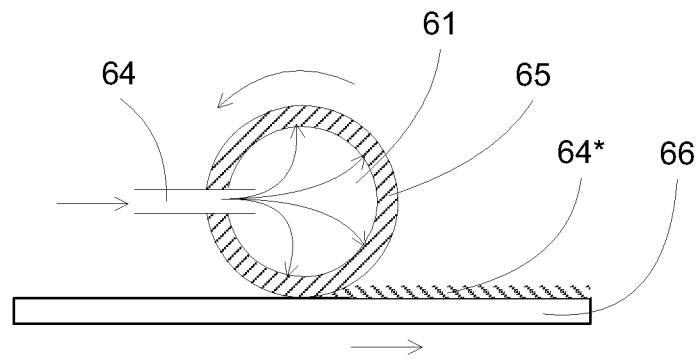
FIGS. 5A-5C illustrate exemplary coating processes according to an embodiment of the present invention.
Figure 5B:
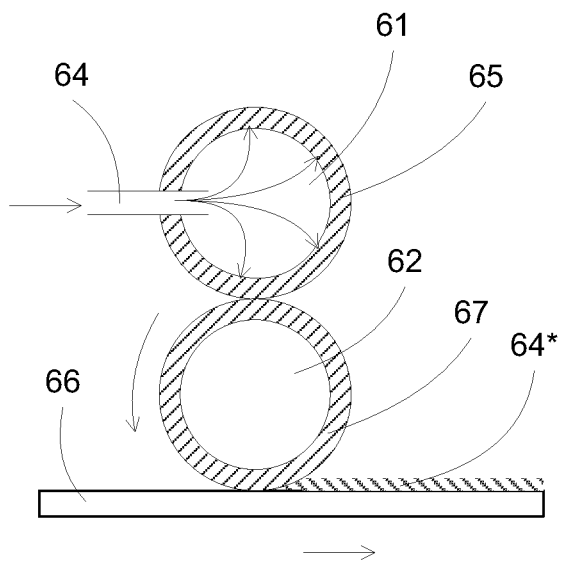
Figure 5C:
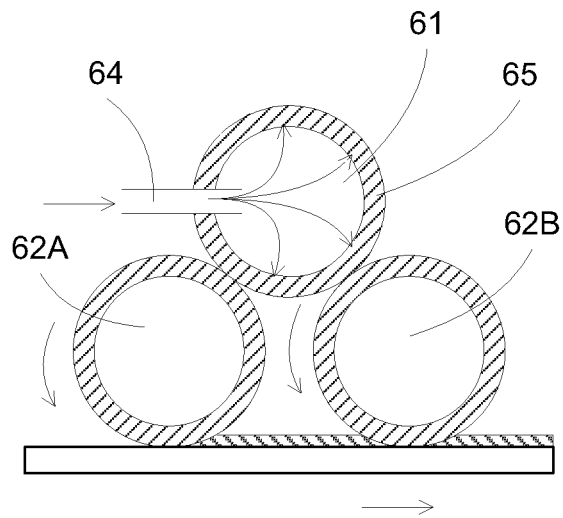

FIGS. 5A-5C illustrate exemplary coating processes according to an embodiment of the present invention. FIG. 5A shows the roller 61 accepting liquid media 64 and distributed to porous layer 65. During direct contact with substrate 66, the liquid media is transferred to the substrate surface, forming layer 64*. The roller 61 rotates to provide an even coating, and at the same time, moving the substrate forward. FIGS. 5B and 5C show roller 61 in indirect contact with substrate 66, through intermediate rollers 62, 62A and 62B.

Uniformity of the coating layers can be controlled by adjusting the liquid media available at the surfaces of the rollers. In general, an even distribution of the liquid media along the length of the roller can create a uniform coating on the substrates along the direction perpendicular to the path of travel. Using multiple rollers, the uniformity along the direction of travel can be further improved.

Figure 6A:
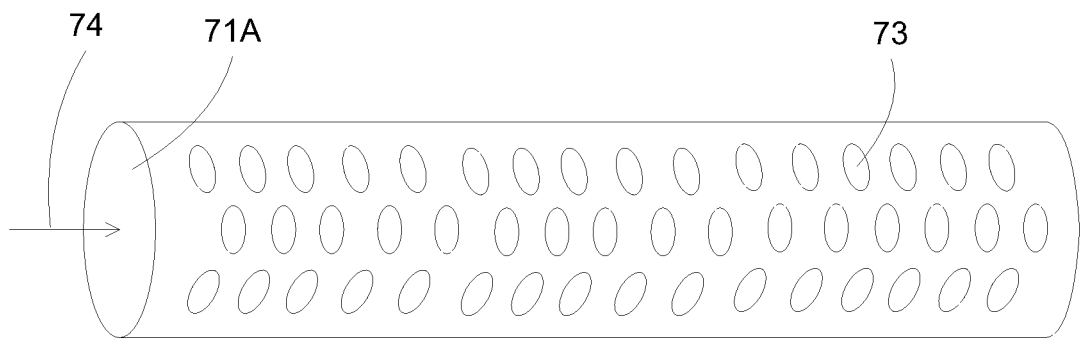
FIGS. 6A-6D illustrate exemplary rollers for uniform deposition according to an embodiment of the present invention.
Figure 6B:
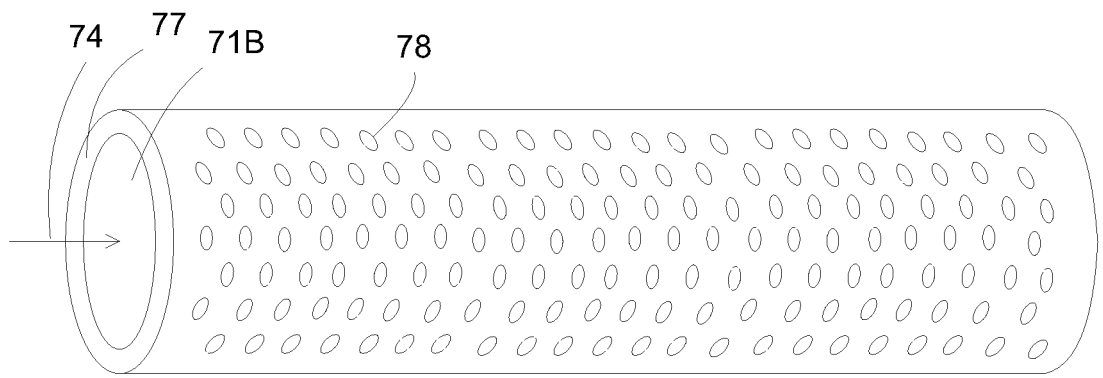
Figure 6C:
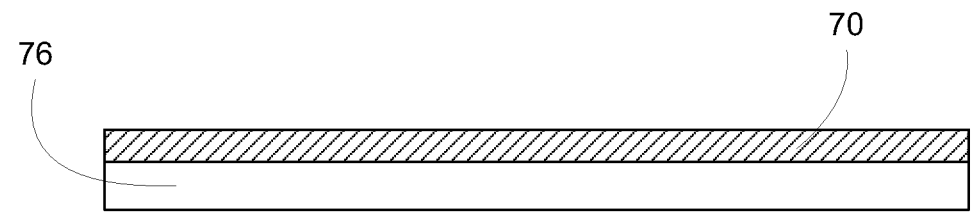
Figure 6D:
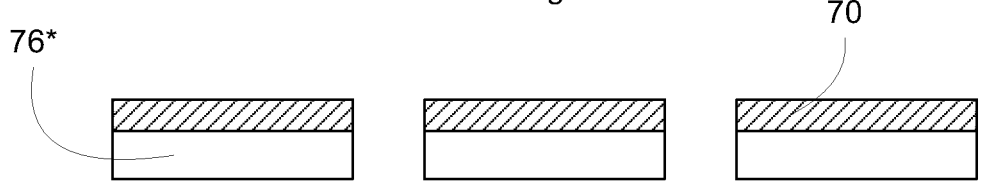

FIGS. 6A-6D illustrate exemplary rollers for uniform deposition according to an embodiment of the present invention. FIG. 6A shows roller 71A with uniform distribution of perforation holes 73 along the length of the roller. When the liquid media 74 enters the roller 71A at one end (e.g., at the extreme end, or at a vicinity of the extreme end), the uniform distribution of perforation holes can enable a uniform distribution of liquid media on the substrate surfaces. The perforation holes are shown also with uniform distribution along the circumference of the roller, other configurations can be equally effective, such as multiple perforated tubing. FIG. 6B shows roller 71B comprising porous layer 77 having uniform distribution of pore sizes or pore densities 78 along the length of the porous layer 77. Porous layer 77 can be a foam or sponge material, with the pores 78 characterized by the pore size or pore density. Porous layer 77 can be a liquid permeable layer, having uniform permeability along the length of the roller. Having a uniform distribution of liquid media, the coating layer 70 on a large substrate 76 can be uniform across the width of the substrate (FIG. 6C), or the coating 70* can be uniform and similar for multiple substrates 76* disposed along the length of the roller.

Figure 7A:
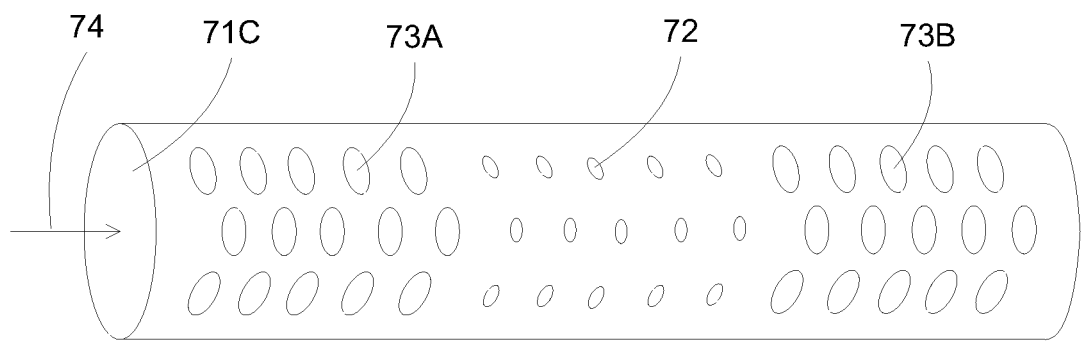
FIGS. 7A-7I illustrate exemplary rollers for non-uniform deposition according to an embodiment of the present invention.
Figure 7B:
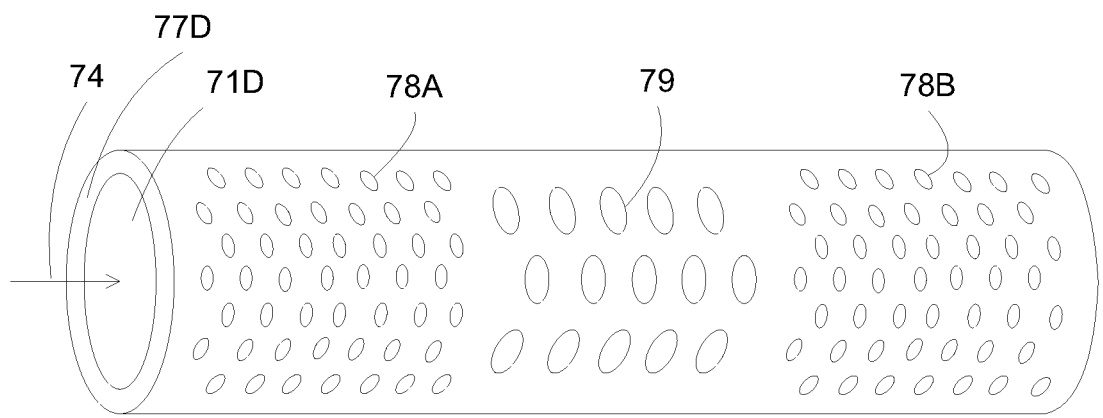
Figure 7C:
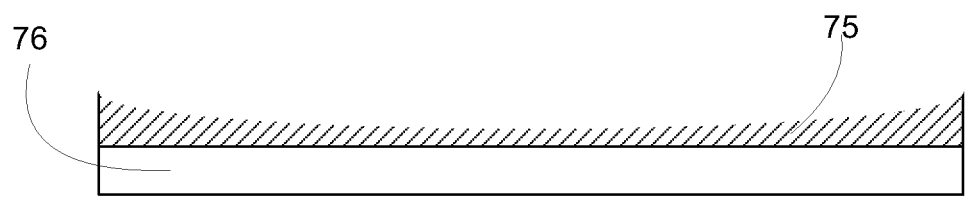
Figure 7D:
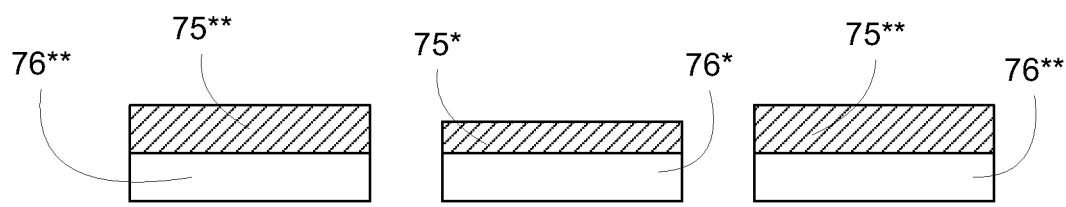

FIGS. 7A-7G illustrate exemplary rollers for non-uniform deposition according to an embodiment of the present invention. FIG. 7A shows roller 71C with different distributions of perforation holes 72 and 73A/73B along the length of the roller. With larger holes 73A/73B at the edges of the roller, as compared to smaller holes 72 in the middle, more liquid can be transferred to the substrates at the edges, creating thicker coating at the edges. Practically any desired distribution of coating thickness can be achieved with appropriate distribution of perforation holes 72/73A/73B. In another configuration, FIG. 7B shows roller 71D comprising porous layer 77D having non-uniform distribution of pore sizes or pore densities 79/78A/78B along the length of the porous layer 77D. Similarly, the porous 77D can generate any desirable distribution of coating thickness, such as a distribution 75 on substrate 76 (FIG. 7C), or thicker coating 75 on outer-edge substrates 76 as compared to thinner coating 75* on inner substrates 76* (FIG. 7D).

Figure 7E:
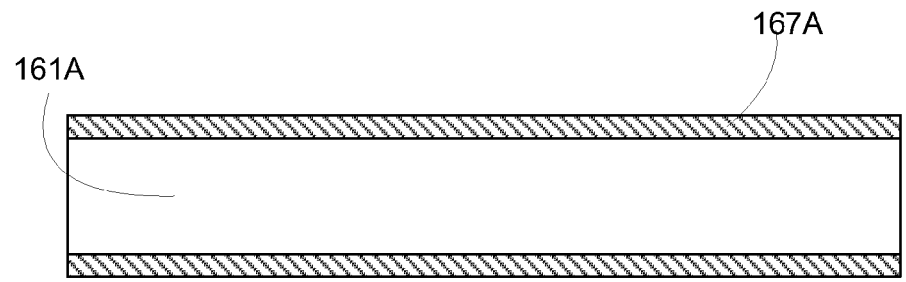

FIGS. 7E-7I illustrate exemplary roller profiles according to an embodiment of the present invention. In FIG. 7E, the roller comprises a cylindrical core 161A and a porous layer 167A covering the outer surface of the core 161A. The core 161A and the porous layer 167A have uniform profiles, e.g., straight cylinder for the core 161A and equal thickness for the porous layer 167A. Profile distribution of the liquid can be accomplished through the distribution of perforation holes in the core 161A or through the pore density of the porous layer 167A along the length of the roller.

Figure 7F:
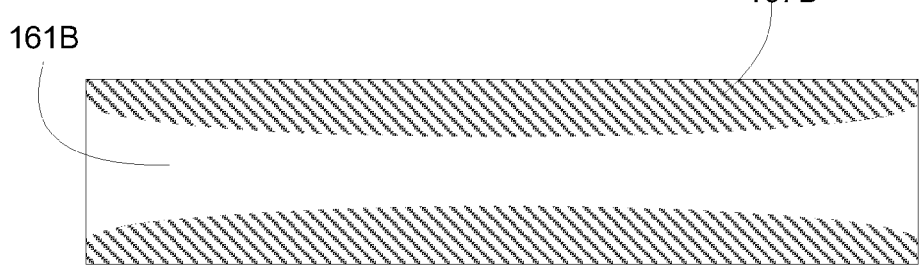
Figure 7G:
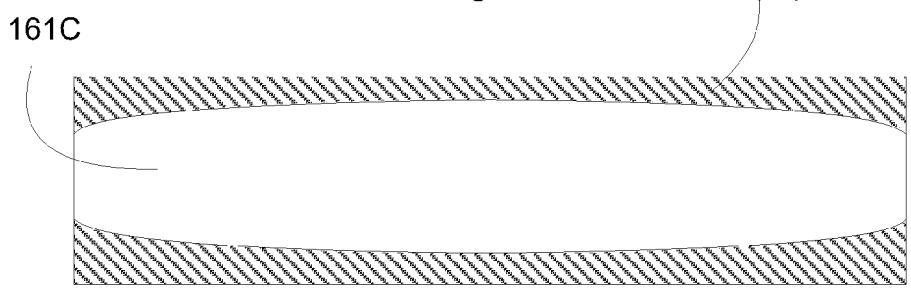

In FIG. 7F, the roller comprises a cylindrical core 161B having a concave inward surface, together with a mated porous layer 167B having thicker layer at the middle than at the ends. The structure of the complete roller (e.g., including core 171B and porous layer 176B) preferably forms a straight cylindrical surface, in order to rollingly contact the substrate. In this configuration, coating thickness can be varied along the length of the roller. For example, for high compression, the end portions are squeezed much more than the middle portion, resulting in more liquid coating at the end portions. For light compression, more fluid is stored in the middle portion (due to thicker porous layer), and can result in more fluid at the middle portion. In FIG. 7G, the roller comprises a cylindrical core 161C having a concave outward surface (or convex), together with a mated porous layer 167C having thinner layer at the middle than at the ends.

Figure 7H:
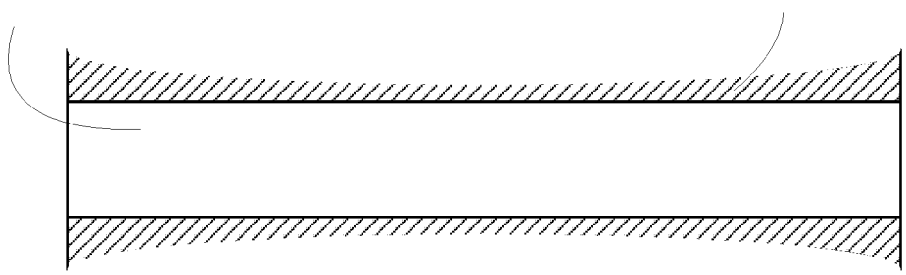
Figure 7I:
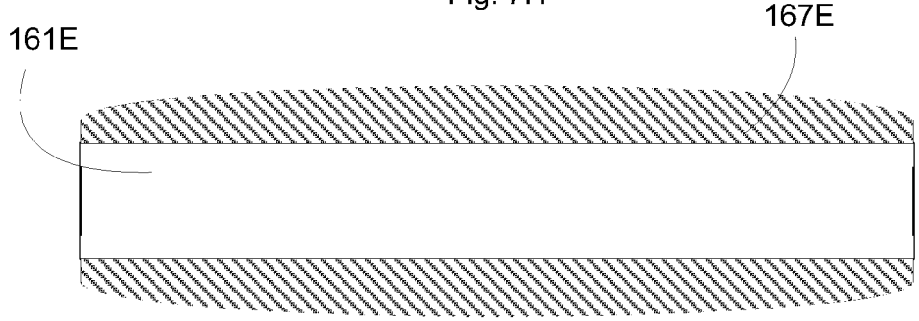

In FIG. 7H, the roller comprises a cylindrical core 161D having a straight surface, together with a concave inward porous layer 167D having thinner layer at the middle than at the ends. In this configuration, with flat substrates, the end portions are compressed more than the middle portion, resulting in more fluid coating at the ends. In FIG. 7I, the roller comprises a cylindrical core 161E having a straight surface, together with a concave outward porous layer 167E having thicker layer at the middle than at the ends. These configurations are exemplary. Other configurations can be used to achieve a desired thickness profile of coating (uniform or non-uniform) along the length of the roller. For example, the rollers may have diameter variations.

In an embodiment, the non-uniform profile of the thickness across the doper is designed to compensate for the non-uniform profile of a subsequent process. An example is the dopant diffusion process. After coating the substrates with a dopant layer, the substrates are annealed in a furnace to drive the dopant into the substrates. For in-line processing, after dopant coating, the substrates will move into an inline furnace with the same arrangements (rows) as they have been in the doper. It is costly to make the temperature in the furnace perfectly uniform in the direction perpendicular to the path of the substrates. For example, the temperature can be higher at the center than at the edge due to the boundary heat loss. This temperature difference can result in different substrate qualities according to their locations inside the furnace, for example, more dopant can be diffused to the substrates at the center than at the edges of the furnace.

The present rollers having core design with multiple types of perforations to apply a non-uniform coating layer on the substrates can compensate for this temperature difference to generate a homogeneous quality of the substrates after the furnace. For example, more chemical can be applied to the substrates at the edges of the doper, resulting in a thicker layer of coating, as compared to the substrates at the center of the doper. Thicker coating layers contain more dopant, which can be used to compensate for the lower temperature in the anneal furnace. Thus substrates positioned at the edges and at the center of the in-line conveyor (which is used to move the substrates from one location to another location) can have similar dopant concentration regardless of the temperature profile in the anneal furnace. Further, the coating layers can be removed after the anneal process, and thus the substrates remain uniform in surface topology.

In an embodiment, the present system comprises one or more temperature control devices, such as heaters or coolers, to provide thermal energy to the substrates or to the chemicals. Some chemicals may require high temperature (e.g., higher than room temperature) before a successful coating, thus heaters can be used to heat the chemicals to a desired temperature. Some chemicals may require low temperature (e.g., temperature lower than room temperature) for coating or for preserving the chemicals, thus coolers can be used to chill the chemicals to a desired temperature. For example, the heaters/coolers can be disposed at the chemical reservoir, at the liquid delivery line, or at the rollers to heat or cool the chemicals directly. In addition, or alternatively, the heaters/coolers can also be disposed at or near the rollers to heat/cool the rollers' surfaces, thus heating or cooling the chemicals when they reach the rollers' surfaces.

Heating or cooling can also be directed to the substrates. For example for deposition of emulgated solid salts to form absorber layers like CdS and ZnS in thin film solar cell manufacturing, the chemicals is heated after deposition, to accelerate the reactions of the chemicals, to dry the liquid chemicals, or to anneal the coating layers. The heaters can be disposed at or near the substrates to heat the substrates' surface, including IR or UV lamps disposed on top and/or bottom of the substrates, or between the rollers. In addition, both heaters and coolers can be used. For example, in deposition of absorber layers, the chemicals are preferably cooled, e.g., by coolers disposed at or near the chemical reservoir or delivery line, to around or below room temperature to preserve the life time of the chemicals. The chemicals are then heated, e.g., by IR heating the substrates, after deposited on the substrates to form the absorber layers.

Figure 8A:
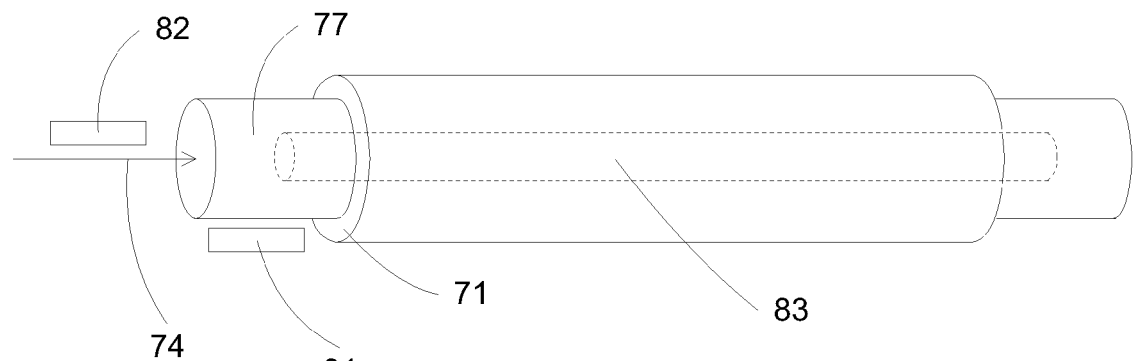
FIGS. 8A-8D illustrate exemplary configurations for heaters according to an embodiment of the present invention.

FIGS. 8A-8D illustrate exemplary configurations for temperature control devices according to an embodiment of the present invention. FIG. 8A shows a roller 77 having foam or solidified foam 71 covering a large portion of the outer surface. A liquid media 74 is delivered to the inside of the roller 77 to be transferred to the foam 71. A temperature control device such as heater or cooler 82 can be disposed in the vicinity of the chemical delivery line, such as wrapping around the piping line, to heat/cool the chemicals to a desirable temperature. A heater/cooler 81 can be disposed in the vicinity of the roller outer surface, such as attaching to an exposed end of the roller, or disposed along the roller 77 under the foam layer 71. A heater/cooler 83 can be disposed inside the roller 77 to heat/cool the roller or to heat/cool the chemical reaching the roller. Any combinations of heaters and coolers can be used.

Figure 8B:
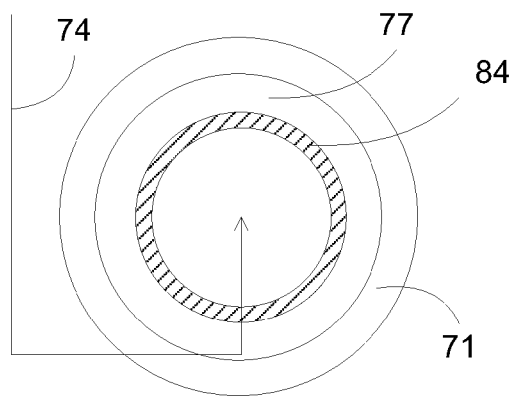
Figure 8C:
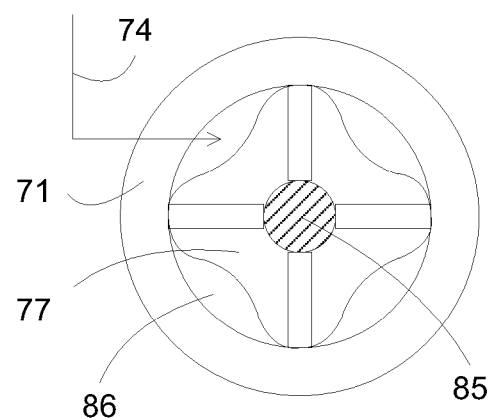
Figure 8D:
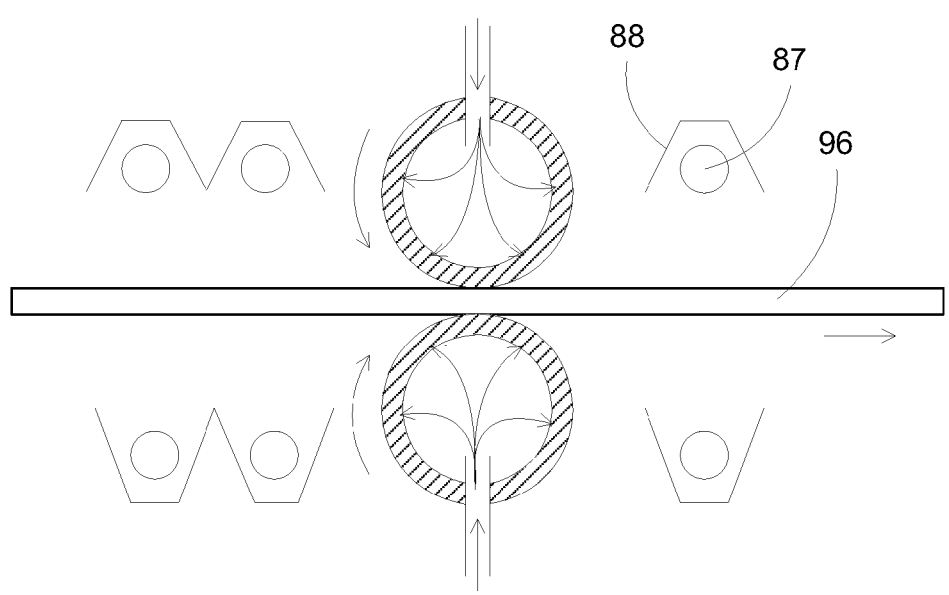

FIG. 8B shows heater/cooler 84 disposed inside the roller 77, such as attached to the inner surface of a hollow roller. FIG. 8C shows heater/cooler 85 disposed in the middle of the roller 77, heating/cooling the roller and the chemicals in the chemical pockets 86. FIG. 8D shows heaters 87 disposed near the rollers to heat the substrate 96 with shielding 88 to direct thermal energy to the substrate 96. Heaters 87 can be disposed between consecutive rollers, at the top of the substrates, at the bottom of the substrates, or both.

In an embodiment, the present invention discloses an in-line deposition system comprising rollers accepting a liquid flow to the inside of the rollers and distributing the liquid to the outer surfaces. The liquid media is protected by the delivery lines, and the only liquid exposed to the environment is the liquid adhered to the roller surfaces. This minimum exposure can improve safety for the deposition system, especially for hazardous liquids such as phosphorous acid or boron trifluoride.

Figure 9A:
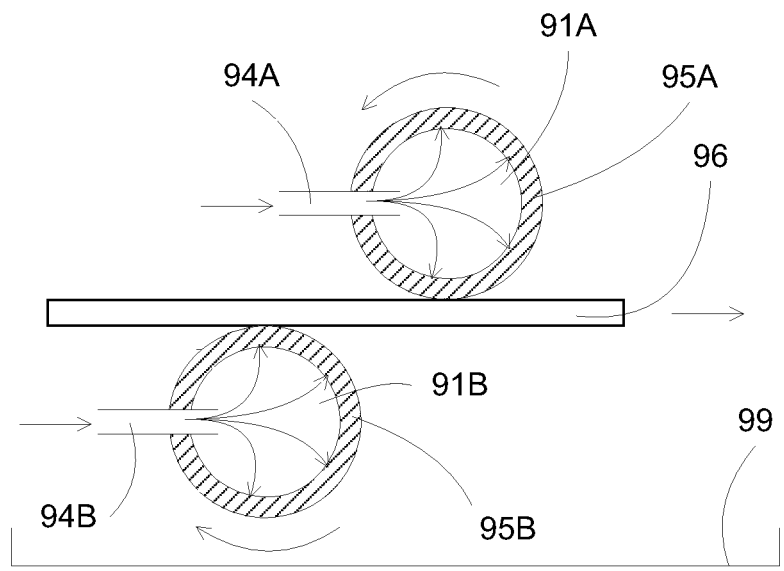
FIGS. 9A-9C illustrate exemplary configurations for liquid coating according to an embodiment of the present invention.
Figure 9B:
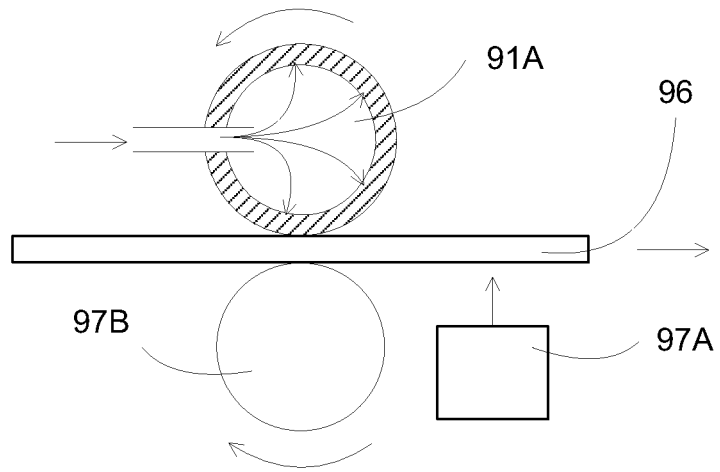
Figure 9C:
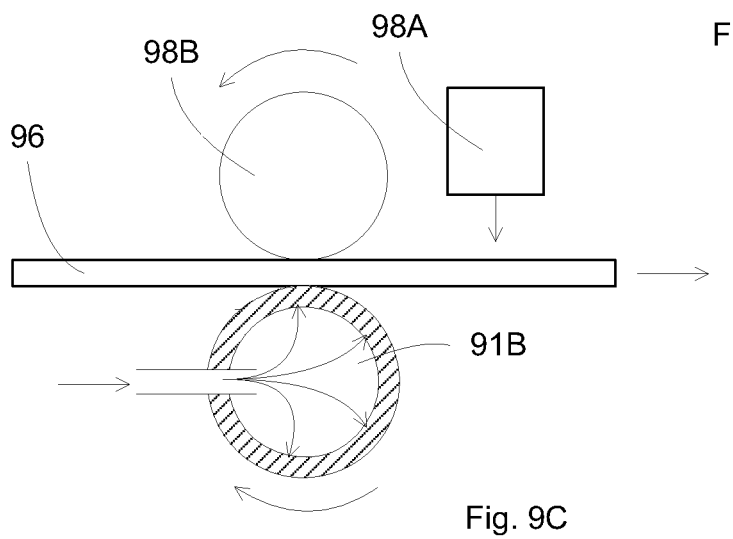

The deposition coating with the present rollers can be performed on both sides of the substrate, or can be applied to only one side. In addition, other types of coating can be included. The substrates can be transported with an in-line transport, such as any type of conveyor or ceramic rollers, to the liquid rollers to be coated, and then to an outlet in-line transport to subsequent processes such as an anneal furnace. Other components can be implemented, for example, exhaust and isolation to prevent hazardous gas from escaping, temperature isolation to provide wall safety, carrier gas and curtain gas for atmospheric isolation and purging, substrate conditioning before removal from the process chamber, such as a drying environment, and spray cleaning system for system cleaning FIGS. 9A-9C illustrate exemplary configurations for liquid coating according to an embodiment of the present invention. FIG. 9A shows a substrate 96 sandwiched between two rotating rollers 91A and 91B. The rollers accept a liquid media 94A and 94B, entering the rollers from one end, and distributing to the rollers' surface. Foam or solidified foam layers 95A and 95B cover the outer surfaces of the rollers, and receive the liquid media from the roller surfaces to be transferred to the substrate 96. With rollers at the top and bottom of the substrate, both sides of the substrate can be coated simultaneously. In addition, the rollers can move the substrate forward, thus acting as transport rollers.

The liquid media flowing to the rollers 91A/91B can be controlled to perform a desired coating on the substrate 96 with minimum excess waste. In addition, the separation of the rollers can be controlled to exert appropriate contact pressure to the substrate 96 to minimize the wasted liquid. For example, a spring can be positioned on top roller 91A to provide a desired pressure to the substrate 96. The multiple independent control mechanisms can eliminate or minimize the excess fluid on the substrate surfaces, such as providing a uniform coating without any liquid droplets. The bottom roller 91B can be fixed around the axis of rotation, and rotated to coat the bottom surface of the substrate, together with forward substrate movement. Optionally, pan 99 can be used to capture any residue liquid.

FIG. 9B shows a roller 91A disposed at top of substrate 96 to deposit a coating layer on the top surface. The bottom surface can have no coating, or have a coating from another coating process 97A. The other coating process can be a liquid spray coating comprising a nozzle delivering chemical media in aerosol or liquid form and with or without carrier gas or solvent, or sponge rollers dipped in liquid chemical media. In addition, the bottom surface can be supported by roller 97B, which can be transport rollers or non liquid-supplied rollers. The roller 97B can be used for transporting the substrate forward, or for exerting contact pressure between the liquid-supplied roller 91A and the substrate 96.

FIG. 9C shows a roller 91B disposed at bottom of substrate 96 to deposit a coating layer on the bottom surface. The top surface can have no coating, or have a coating from another coating process 98A. The bottom liquid roller 91A can be used as transport roller for moving the substrates. In addition, roller 98B can be provided on top of the substrate, which can be non liquid-supplied rollers, and can serve to exert contact pressure between the liquid-supplied roller 91B and the substrate 96.

In an embodiment, all rollers can accept the same liquid media from a single reservoir and pumping system. Alternatively, different rollers can accept different liquid media from multiple reservoirs. Different chemicals can be deposited on top and bottom surfaces. Different chemicals can be deposited on a same surface for a coating mixture. Filling rollers, e.g., rollers without accepting a liquid flow, can be included for other purposes, such as improved media distribution. The liquid media can be all distributed from a single reservoir, or can be individually provided from multiple reservoirs. Flow distribution mechanisms can be included, such as pumping mechanism, pressure controller, flow controller and distribution manifold. Recirculating mechanism and automatic refilling can also be included.

Figure 10A:
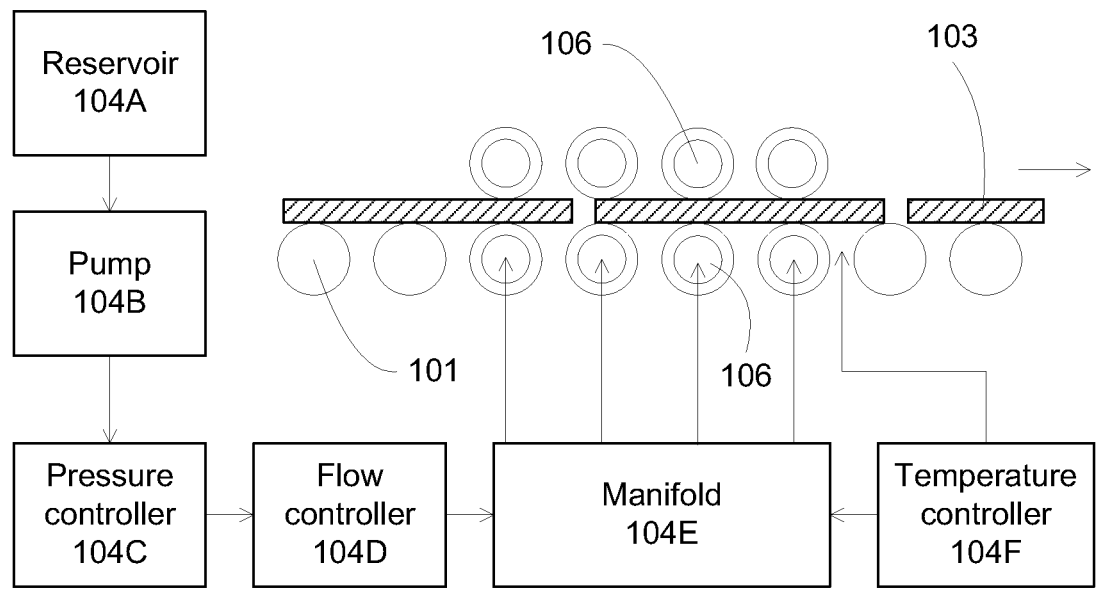
FIGS. 10A-10C illustrate exemplary configurations of liquid media distributions in an in-line deposition system according to an embodiment of the present invention.
Figure 10B:
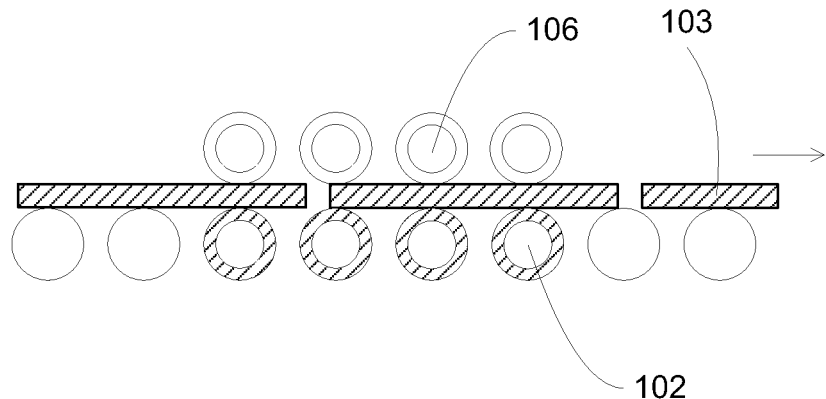
Figure 10C:
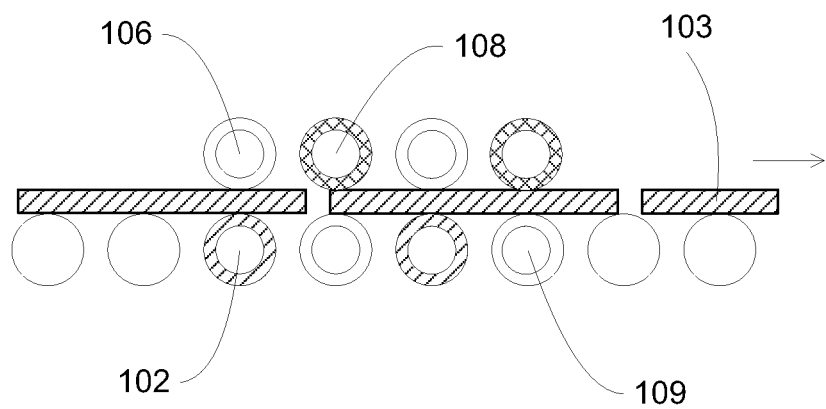

FIGS. 10A-10C illustrate exemplary configurations of liquid media distributions in an in-line deposition system according to an embodiment of the present invention. FIG. 10A shows substrates 103 moving by rolling conveyor rollers 101. Bottom liquid rollers 106 can replace conveyor rollers 101 to continue moving the substrates forward, together with providing a liquid coating on the bottom surfaces. Top liquid rollers are disposed with appropriate pressure to deposit a top coating with minimum excess liquid residue.

The liquid media can be provided to the rollers from one or more reservoirs. For example, a reservoir 104A containing chemical liquid can provide liquid media to a pump 104B, which can push the liquid media to the rollers 106. A pressure controller 104C and a flow controller 104D can be added to regulate the pressure and flow to the rollers. Manifold 104E serves to distribute the liquid media to the rollers. Temperature controller 104F can provide heat or cooling to the liquid media and/or the substrates. For simplicity, the manifold is shown distributing the same liquid media with same pressure and flow to the bottom rollers 106, but the invention is not so restricted. Different configurations can be used, such as a manifold distributing liquid media to all rollers, or different delivery systems can be added to deliver different chemicals with different pressures and different flows to different rollers.

The flow and pressure controllers can regulate the liquid media that is to be provided to the substrate surfaces, which can serve to optimize the coating process, such as minimizing the excess liquid to the substrates, or regulating a desired coating to the substrates with liquid media having different properties such as higher or lower viscosity or higher or lower reaction rates with the substrates. The present liquid delivery system can further prevent reactions in the delivery lines, such as at the rollers or at the liquid source. For example, the present liquid roller can be used to deposit an absorber layer for solar cell device, with crystallization occurring at the substrate surfaces instead of at the roller surfaces. The multiple independent controllers of flow rate, flow pressure, roller pressure, chemical temperature and substrate temperature can provide an optimized coating on the substrate surfaces, for example, a uniform coating layer with zero or minimum liquid droplet or excess liquid waste.

The top and bottom rollers can accept different liquid media for different coating material. FIG. 10B shows the top rollers 106 accepting a chemical solution and bottom rollers 102 accepting another chemical solution. The top and bottom rollers can rotate at a same speed or at different speeds. For example, for same liquid media on top and bottom rollers, the top and bottom rollers can rotate at a same speed for depositing a similar coating layer on top and bottom surfaces of the substrates. For different liquid media, the top and bottom rollers can rotate at appropriate speeds, which can be the same or different from each other.

Additional rollers can be added. For example, one or more dry rollers can be provided for better liquid media distribution. The dry rollers can be disposed alternate to the liquid rollers, or can be disposed at selected locations. The dry rollers can be rollers without any wetting liquid, roller without accepting liquid from the inside, or rollers with vacuum suction (instead of liquid flowing) to dry the porous layer, or brush rollers.

Different rollers can be used on a same surface. FIG. 10C shows alternate rollers 108 for top rollers 106 and alternate rollers 109 for bottom rollers 102. The alternate rollers can provide different chemical liquid for coating mixture. The alternate rollers can be dry rollers.

Figure 11A:
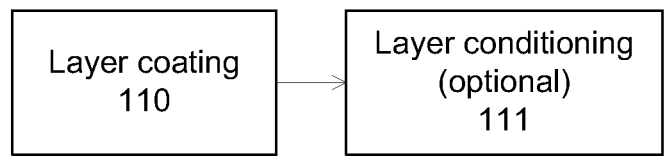
FIGS. 11A-11C illustrate an exemplary coating process according to an embodiment of the present invention.
Figure 11B:
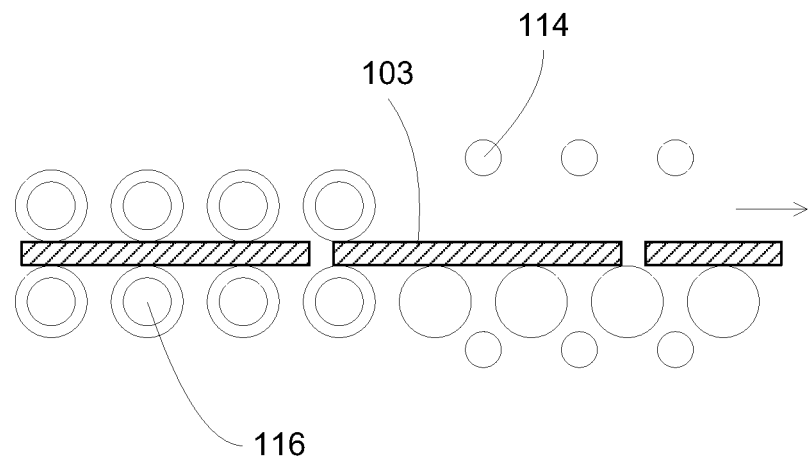
Figure 11C:
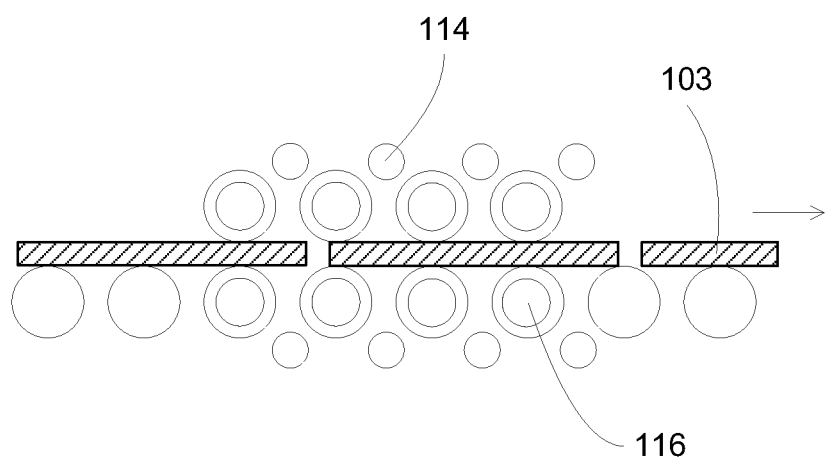

In an embodiment, the present invention discloses deposition processes using continuous liquid media supply. FIGS. 11A-11C illustrate an exemplary deposition process according to an embodiment of the present invention. In FIG. 11A, a substrate is coated 110 with a liquid layer using liquid rollers and then optionally underwent a layer conditioning process 111. The layer conditioning process is optional, meaning it will serve to conditioning the deposited layer only if needed. For example, some processes require a liquid layer as deposited and thus no conditioning process is needed. The conditioning process can be a drying process, for example, by a heater or be a drying roller. The drying process is optional, meaning an active drying process is not necessary, for example, the deposition process can be air dried, or the drying process can be embedded in subsequent process, for example, in a subsequent annealing process.

FIG. 11B illustrates an exemplary configuration of separate coating and drying, comprising separate coating station comprising liquid rollers 116 and conditioning/drying station comprising heater 114. When the transport rollers transfer the substrates 103 to the coating station, liquid rollers 116 deposit a liquid coating on the substrates. As shown, the liquid rollers deposit coating layers on both top and bottom, with similar rollers, but other configurations can be used. After completing the coating layers, the substrates are transported, by the same bottom liquid rollers 116, to the drying station to be dried by the thermal energy provided by heaters 114. As shown, heaters 114 comprising IR heaters disposed in parallel to the rollers for heating the substrates as the substrates passing through, but other heating configurations can be used, such as different orientations, or different types of heaters.

FIG. 11C illustrates an exemplary configuration of integrated deposition and drying. The coating station and the drying station are integrated to a deposition station, where the heaters 114 and the liquid rollers 116 are disposed next to each other, so that the liquid coating from each roller 116 can be heated immediately by the next heater 114. Other configurations can be used, such as multiple heaters 114 after one liquid roller 116, or one heater 114 after multiple liquid rollers 116.

Figure 12A:
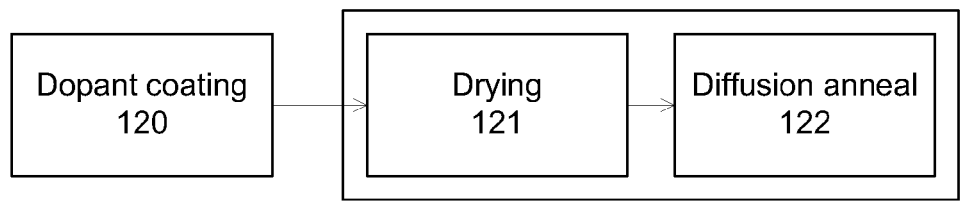
FIGS. 12A-12C illustrate an exemplary doping process according to an embodiment of the present invention.
Figure 12B:
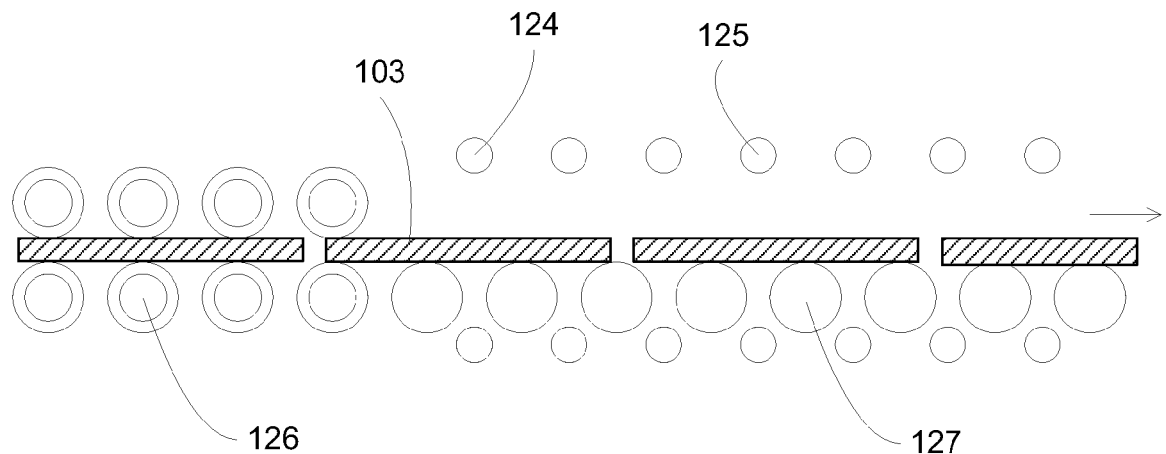
Figure 12C:
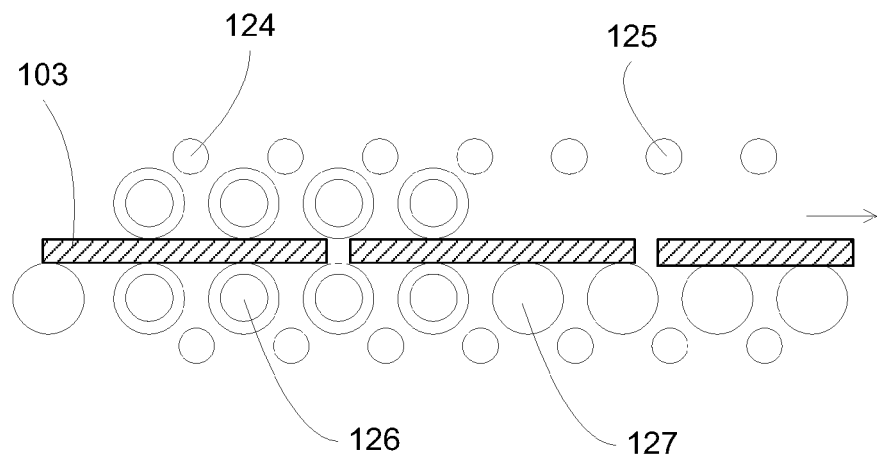

FIGS. 12A-12C illustrate an exemplary deposition process according to an embodiment of the present invention. In FIG. 12A, a substrate is coated 120 with a dopant liquid layer using liquid rollers, dried 121 to form a solid layer, and then annealed in a furnace to drive the dopant under the substrate surface. The drying process can be omitted, or can be embedded in the annealing process. FIG. 12B illustrates an exemplary configuration of coating, drying and annealing, comprising separate coating station comprising liquid rollers 126 and drying station comprising heater 124. When the transport rollers 127 transfer the substrates 103 to the coating station, liquid rollers 126 deposit a liquid coating on the substrates. After completing the coating layers, the substrates are transported, by the same bottom liquid rollers 126, to the drying station to be dried by the thermal energy provided by heaters 124. The substrates are then transferred to an anneal furnace using heaters 125.

FIG. 12C illustrates an exemplary configuration of integrated coating and drying. The coating station and the drying station are integrated to a deposition station, where the heaters 124 and the liquid rollers 126 are disposed next to each other, so that the liquid coating from each roller 126 can be heated immediately by the next heater 124. After drying, the substrates are annealed by the heaters 125. Alternatively, the drying step can be skipped, or incorporated in the anneal process. For example, the anneal process can include a pre-anneal step before a main anneal step, and the drying process can be included in the pre-anneal step.

In an embodiment, the present invention discloses methods for depositing liquids on substrates, comprising using a roller accepting liquid media at at least one end and migrating the liquid to the outer surfaces for contact coating. The end of the roller accepting the liquid media can be an extreme end, such as the end surface of a cylindrical roller, or can be near the extreme end, such as on the outer surface of the roller close to the end surface. The roller has channels to bring the liquid media to the outer surface of the roller, such as the circumference surface of a cylindrical roller.

Figure 13A:
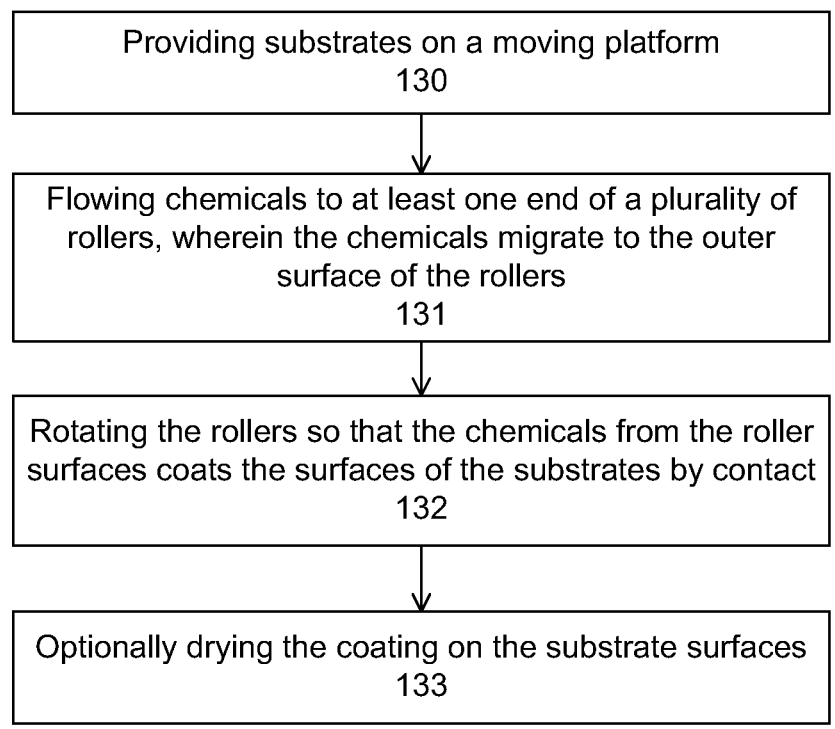
FIGS. 13A-13C illustrate exemplary flowcharts of liquid deposition according to an embodiment of the present invention.
Figure 13B:
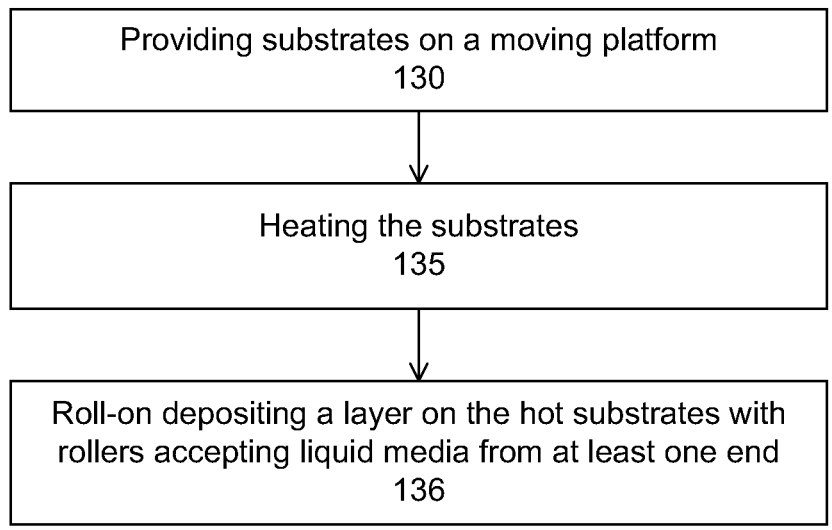

FIGS. 13A-13B illustrate exemplary flowcharts of liquid deposition according to an embodiment of the present invention. In FIG. 13A, operation 130 provides one or more substrates on a moving platform, for example, a large flat panel substrate or multiple semiconductor substrates placed in rows. The moving platform can be an in-line conveyor, comprising means such as rollers to move the substrates from one process station to another process station. The moving platform can be an input station for an in-line coating station, accepting substrates and transferring the substrates to the coating zone. The substrate can be prepared before entering the coating station, for example, by a surface cleaning process to remove impurities or particulates, or by an oxidation process to form an oxide layer. In certain cases, the native oxide on the substrate might not be desirable, and thus a HF solution cleaning might be performed to provide a clean surface. The substrate can be transported to an enclosure, for example, by a substrate moving mechanism, or the substrate can move continuously through the enclosure, for example, by an in-line transport mechanism.

In operation 131, the substrates enter a coating zone comprising a plurality of liquid rollers, some of which also acting as transport rollers to move the substrates forward. Liquid media is flowing to at least one end of the liquid rollers, where the liquid media is transferred to the outer surface of the rollers. Optional foam material covering the rollers can be used for improving the coating process, such as reducing substrate damage and improving distribution of liquid media on the substrates. The rollers can have channels, such as hollow cylindrical tubes, or grooves along the length of the rollers, to guide the liquid media.

In operation 132, the rollers are rotating so that the liquid media from the roller surfaces coats the substrate surfaces by contact. In addition, the rotating transport rollers move the substrates to the end of the coating zone. Means for improving the coating layers can be included, such as dry rollers disposed after the liquid rollers for better media distribution.

In optional operation 133, the coating layers are conditioned, for example, drying by thermal energy such as IR lamps or by other forms of energy excitation to the liquid coatings, or by one or more dry rollers. The drying zone can be disposed after the coating zone, for example, by disposing IR heaters after the liquid rollers. Alternatively, the drying zone can be integrated with the coating zone, for example, by disposing IR heaters alternatedly with the liquid rollers.

Additional elements can be used in the deposition process. For example, for deposition processes requiring hot chemicals, heaters can be used to heat the liquid supplier before reaching the substrates. For deposition processes requiring high temperature substrates for activating chemical reactions, heaters can be used to heat the substrates. In addition, temperature control devices can be used to keep the chemicals in appropriate temperature, such as cooling or heating.

FIG. 13B shows an exemplary process for depositing a layer. Operation 130 provides one or more substrates on a moving platform. In operation 135, the substrates are heated to a desired temperature, such as a temperature to accelerate the reactions of the chemicals deposited thereon, to evaporate the liquid carrier in the chemicals, or to anneal the deposited layers. In operation 136, the heated substrates receive a rolled-on deposition of a liquid layer by a plurality of liquid rollers accepting liquid media from at least one end of the rollers. For example, the liquid layer can be an absorber layer in a solar cell device structure, with the absorber chemicals comprising a suspension of small globules of absorber elements in a liquid medium. The absorber chemicals can be stored and delivered at room temperature or sub-room temperature to prevent reaction and prolong the chemical life time. The cooled chemicals are then deposited on hot substrates, using thermal energy to activate a reaction, forming a thin film layer on the substrates.

Figure 13C:
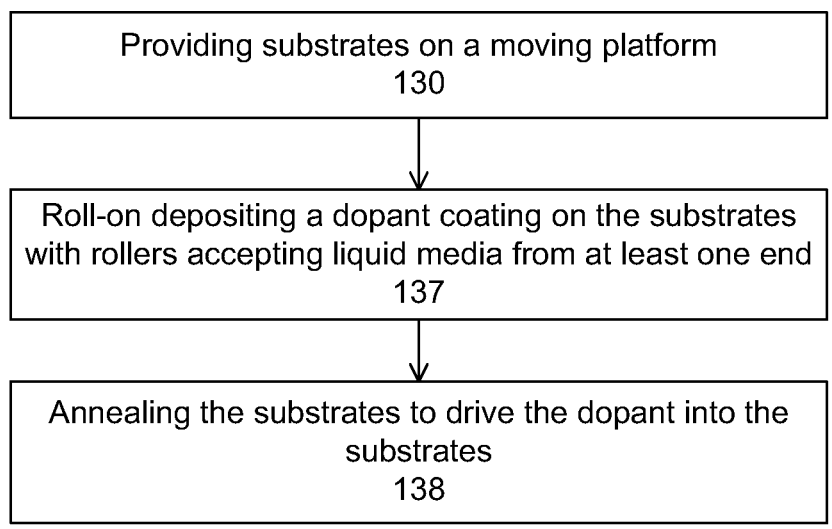

FIG. 13C shows an exemplary process for depositing a dopant layer. Operation 130 provides one or more substrates on a moving platform. In operation 137, the substrates receive a rolled-on deposition of a dopant coating layer by a plurality of liquid rollers accepting liquid media from at least one end of the rollers. The dopant layers comprise a doping element, which reacts with the substrates to form pn junctions.

In operation 138, the substrates enter a diffusion furnace to drive the dopant to the substrates. The furnace can comprise a plurality of heaters to heat the coating layers to a high temperature, such as between 600 and 1000 C. The furnace can comprise a pre-heating zone, acting to form a transition temperature zone between the hot furnace zone and the room temperature ambient. The pre-heating zone can also act as a drying zone for drying the liquid coating layers.

In an embodiment, the present invention discloses improvements to the roll-on coating process using liquid supplied rollers. For example, pressing mechanisms can be included to apply a desired pressure to the liquid rollers, enabling wet coating on the substrates without or with minimum excess liquid. The liquid media can be regulated to compensate for different liquid properties, such as viscosity, evaporation property, density, or reactivity, using active mechanism such as pumps and controllers.

Figure 14A:
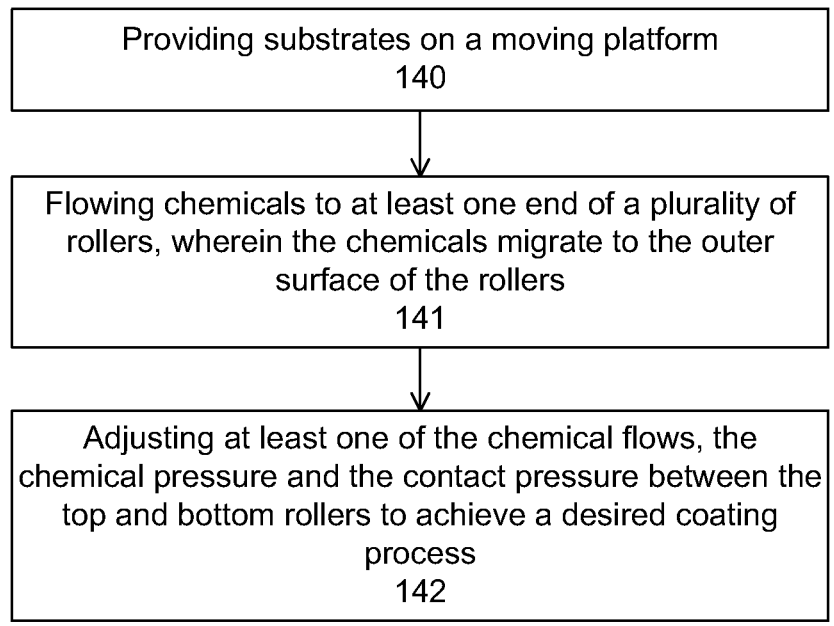
FIGS. 14A-14B illustrate exemplary flowcharts for liquid deposition controls according to an embodiment of the present invention.
Figure 14B:
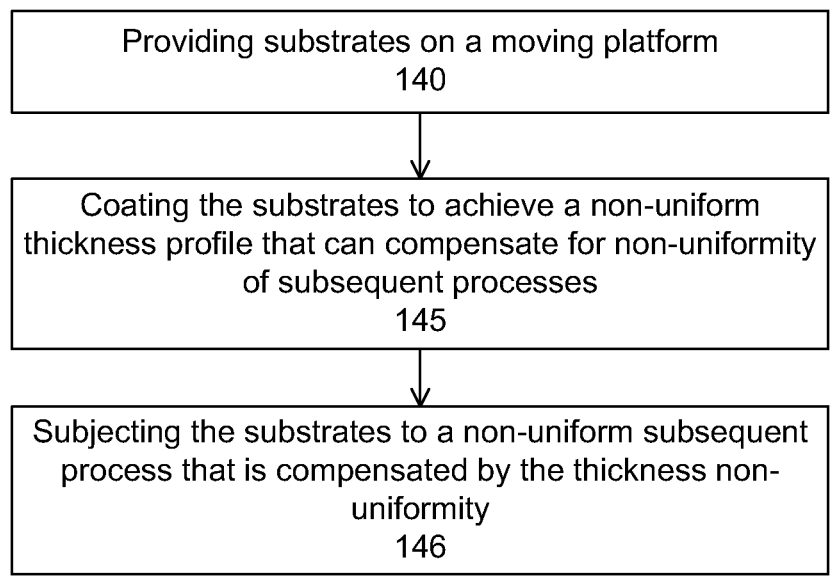

FIGS. 14A-14B illustrate exemplary flowcharts for liquid deposition controls according to an embodiment of the present invention. In FIG. 14A, the liquid media delivered to the substrates is controlled to achieve a desired goal, such as optimizing the coating and minimizing operation cost. Operation 140 provides one or more substrates on a moving platform. In operation 141, liquid media is flowing to at least one end of the liquid rollers, where the liquid media is transferred to the outer surface of the rollers for coating the substrates with the rollers rotated to apply an even coating onto the substrate surfaces.

In operation 142, at least one of the liquid temperature, the liquid flow rate, the fluid concentration, the fluid temperature, and the liquid pressure are regulated to achieve a desired coating layer on the substrate surfaces. Further, in the case of coating using top and bottom rollers, the contact pressure between the top and bottom rollers can be controlled to obtain optimum coating conditions, such as having a desired coating, minimizing excess fluid waste, or compensating for the variations of liquid media properties. The multiple control mechanisms can offer significant advantages, for example, enabling a deposition process having zero or minimum droplets or excess fluid media, allowing a uniform coating layer with reduced consumable chemicals. The consistency of the fluid, and other fluid properties, such as concentration or temperature, can be controlled to ensure consistency and desired properties of the deposited layer.

In FIG. 14B, coating layers on the substrate surfaces are controlled to compensate for a non-uniformity of subsequent process. Operation 140 provides one or more substrates on a moving platform. The substrates are exposed to a plurality of liquid supplied rollers for rolling deposition a coating on the substrate surfaces. Operation 145 controls the coating thickness uniformity on the substrates to achieve a non-uniform thickness profile. The coating can comprise a dopant layer that will be subjected to a subsequent anneal process. The non-uniform thickness profile can be used to compensate for the non-uniformity of other process, such as a non-uniform temperature profile in the furnace of a subsequent anneal. Operation 146 subjects the non-uniform substrates to a non-uniform subsequent process that can be compensated by the thickness non-uniformity. For example, the temperature can be non-uniform in an anneal furnace, and the thickness of the substrates can be used to compensate for this temperature non-uniformity so that a uniform doping profile can be achieved.

In an embodiment, the present invention discloses different process conditions for achieving a desired coating using liquid rollers. For example, top and bottom rollers can accept different liquid media to enable coating different layers on the top and bottom of the substrates. Different liquid media can be applied to alternating rollers to enable mixing layers or laminate layers.

Figure 15A:
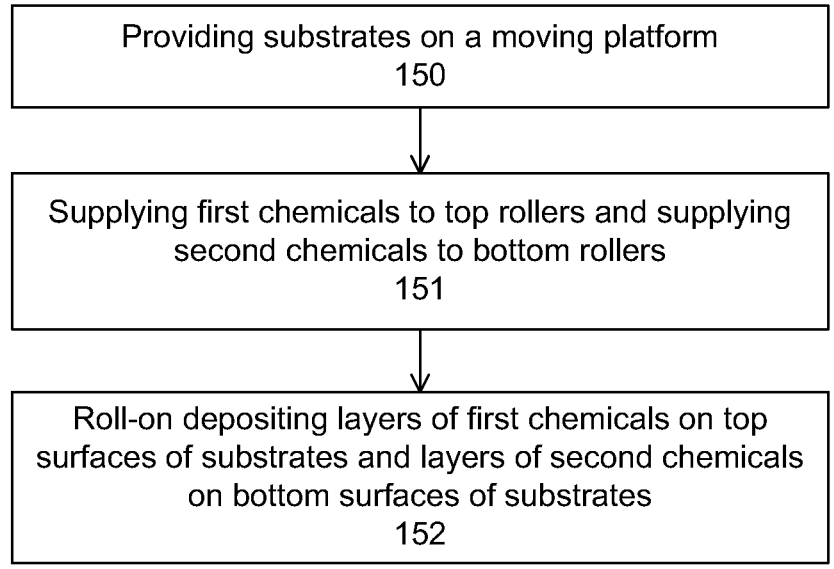
FIGS. 15A-15B illustrate exemplary flowcharts for different liquid deposition processes according to an embodiment of the present invention.
Figure 15B:
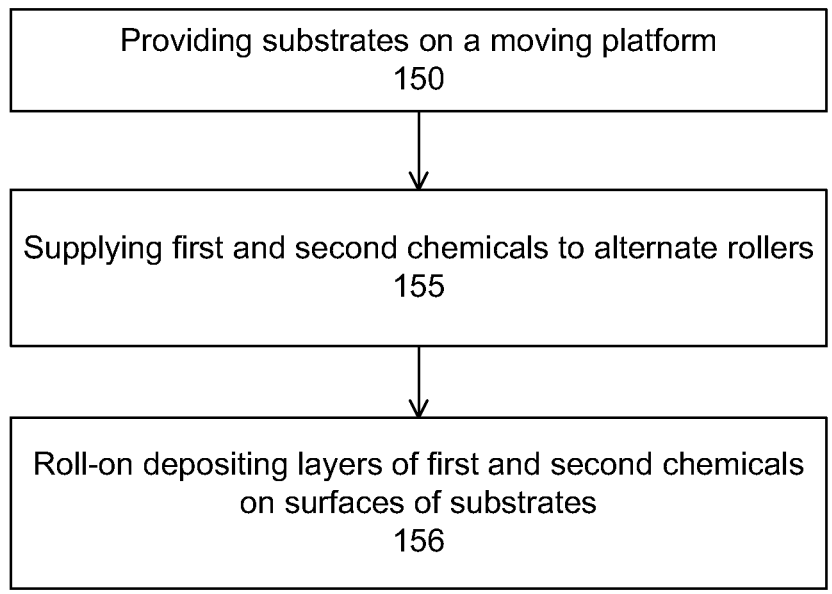

FIGS. 15A-15B illustrate exemplary flowcharts for different liquid deposition processes according to an embodiment of the present invention. In FIG. 15A, different coating layers can be applied to the top and bottom surfaces of the substrates. Operation 150 provides one or more substrates on a moving platform. In operation 151, first liquid media is applied to the top rollers and second liquid media is applied to the bottom rollers. In operation 152, the rollers are rotated to deposit different coating layers on the top and bottom of the substrates.

In FIG. 15B, mixed coating or laminate coating can be applied to the substrates. Operation 150 provides one or more substrates on a moving platform. In operation 155, first and second liquid media are applied to alternate rollers. In addition, top and bottom rollers can accept similar or different liquid media. In operation 156, the rollers are rotated to deposit coating layers on the substrates.

While the present invention has been described with respect to a preferred mode thereof, it will be apparent that numerous alterations and modifications will be apparent to those skilled in the art without departing from the spirit of the invention. As in all such obvious alterations and modifications, it is desired that they be included within the purview of my invention, which is to be limited only by the scope, including equivalents, of the following appended claims.

What is claimed is:

1. A deposition system for depositing a coating on a substrate, comprising:
    a plurality of rotatable fluid-supplied rollers, wherein the rollers are configured to deliver a fluid coating on the substrate, wherein the coating is non-uniform in thickness in a direction along a length of the rollers, wherein the thickness non-uniformity delivered by the rollers is configured to compensate for a non-uniform subsequent process so that after the non-uniform subsequent process, a uniform substrate is achieved from the combination of the non-uniform coating and the non-uniform subsequent process, each roller comprising
        an elongated rod comprising a coupler for accepting a fluid at an end of the rod, the elongated rod configured to transfer the fluid from the end of the rod to a portion of the elongated outer surface of the rod;
        a porous layer covering a portion of the elongated outer surface of the rod, wherein the porous layer receives the fluid at the outer surface of the rod;
    a fixed fluid delivery line coupled to the coupler for delivering fluid to the rollers, wherein the coupler comprises a rotatable element for enabling coupling the rotating roller to the fixed fluid delivery line; and
    a rotating mechanism for rotating the fluid-supplied rollers.

2. A deposition system as in claim 1 wherein the rotating mechanism comprises a motor.

3. A deposition system as in claim 1 wherein the rollers are rotated at an identical speed.

4. A deposition system as in claim 1 wherein the rollers are rotated at different speeds.

5. A deposition system as in claim 1 wherein the rotation speed is adjustable for each roller.

6. A deposition system as in claim 1 wherein the fluid-supplied rollers comprise first rollers which are disposed at two sides of the substrates.

7. A deposition system as in claim 6 wherein the fluid delivery system delivers a same fluid to the top and bottom fluid-supplied rollers.

8. A deposition system as in claim 6 wherein the fluid delivery line delivers different fluids to the first rollers.

9. A deposition system as in claim 1 wherein the fluid-supplied rollers are disposed at the bottom of the substrates, and further act as transport rollers for transporting the substrates.

10. A deposition system as in claim 1 wherein the fluid-supplied rollers are disposed at the top of the substrates.

11. A deposition system as in claim 1 wherein the fluid delivery line delivers different fluids to alternate fluid-supplied rollers.

12. A deposition system as in claim 1 wherein the fluid delivery line is coupled with a fluid system comprising at least one of a reservoir, a pump, a pressure controller, a flow controller, and a temperature controller.

13. A deposition system as in claim 1 further comprising:
    one or more non fluid supplied rollers disposed parallel to the fluid-supplied rollers.

14. A deposition system as in claim 1 further comprising:
    one or more heaters disposed in the vicinity of the fluid-supplied rollers for conditioning the deposited coating.

15. A deposition system as in claim 1 further comprising:
    means for adjusting and controlling the contact pressure between the fluid-supplied rollers and the substrates.

16. A deposition system as in claim 1 wherein the rollers comprise perforation holes, wherein the distribution of the perforation holes is non uniform along the length of the rollers.

17. A deposition system as in claim 1 wherein the rollers comprise perforation holes, wherein the perforation holes at an edge of the rollers is larger than the perforation holes at a middle of the rollers.

18. A deposition system as in claim 1 wherein the porous layer comprises a non uniform distribution of pore sizes or pore densities along the length of the rollers.

19. A deposition system as in claim 1 wherein the elongated rod has a concave inward surface, and wherein the porous layer has a higher thickness at a middle of the roller than the thickness at an edge of the roller.

20. A deposition system as in claim 1 wherein the elongated rod has a concave outward surface, and wherein the porous layer has a higher thickness at an edge of the roller than the thickness at a middle of the roller.

21. A deposition system as in claim 1 wherein the porous layer has a concave inward surface.

22. A deposition system as in claim 1 wherein the porous layer has a concave outward surface.

* * * * *